United States Patent
Kubota et al.

(10) Patent No.: US 6,781,148 B2
(45) Date of Patent: Aug. 24, 2004

(54) LIGHT EMITTING DEVICE

(75) Inventors: Yuichi Kubota, Tokyo (JP); Michio Arai, Tokyo (JP)

(73) Assignee: TDK Corporation, Tokyo (JP)

( * ) Notice: Subject to any disclaimer, the term of this patent is extended or adjusted under 35 U.S.C. 154(b) by 60 days.

(21) Appl. No.: 10/103,888

(22) Filed: Mar. 25, 2002

(65) Prior Publication Data

US 2002/0113241 A1 Aug. 22, 2002

Related U.S. Application Data

(63) Continuation of application No. PCT/JP01/06366, filed on Jul. 24, 2001.

(30) Foreign Application Priority Data

Jul. 24, 2000 (JP) ........................................ 2000-222496
Nov. 24, 2000 (JP) ........................................ 2000-358352

(51) Int. Cl.$^7$ ............................................... H01L 35/24

(52) U.S. Cl. ........................................... 257/40; 438/99

(58) Field of Search ............................. 257/40; 438/99

(56) References Cited

U.S. PATENT DOCUMENTS

| | | | | |
|---|---|---|---|---|
| 5,145,812 A | * | 9/1992 | Arai et al. | 501/97 |
| 5,529,879 A | * | 6/1996 | Hoshino et al. | 430/160 |
| 5,540,999 A | * | 7/1996 | Yamamoto et al. | 428/411.1 |
| 5,627,404 A | * | 5/1997 | Takenouchi et al. | 257/642 |

FOREIGN PATENT DOCUMENTS

| | | |
|---|---|---|
| JP | 8-236274 | 9/1996 |
| JP | 10-24519 | 1/1998 |
| JP | 10-194873 | 7/1998 |
| JP | 11-54266 | 2/1999 |
| JP | 11-74083 | 3/1999 |
| JP | 2000-58256 | 2/2000 |
| JP | 2000-353592 | 12/2000 |

* cited by examiner

*Primary Examiner*—Wael Fahmy
*Assistant Examiner*—Wai-Sing Louie
(74) *Attorney, Agent, or Firm*—Oblon, Spivak, McClelland, Maier & Neustadt, P.C.

(57) ABSTRACT

The invention aims to provide a light emitting device comprising a base material or protective member which has improved light transmittance, heat resistance, passivation (gas barrier, oligomer release prevention and minimized outgassing), anti-water or moisture-absorption, stability against chemical degradation, dimensional and shape stability, anti-surface-reflection, electrical insulation, UV degradation resistance, and weather resistance, and is highly productive due to possible film formation under atmospheric pressure, and hence, a light emitting device featuring high reliability, ease of manufacture and low cost. The object is attained by a light emitting device comprising a base material (1) having flexibility, light transparency and heat resistance, a lower electrode (4) having light transmittance, a light emitting layer (4), and an upper electrode (4) formed on the base material, the device further comprising a silica film and/or a siliceous film (3) which is formed on the substrate side as viewed from the light emitting layer (4) or on opposite sides of the substrate by applying polysilazane and subjecting it to oxidative treatment.

23 Claims, 2 Drawing Sheets

LIGHT EMITTING DEVICE

CROSS-REFERENCE TO RELATED APPLICATION

This application is a continuation and claims priority to International Application No. PCT/JP01/06366 filed Jul. 24, 2001 and Japanese Application Nos. 2000-222496 filed Jul. 24, 2000 and 2000-358352 Nov. 24, 2000, and the entire content of both applications is hereby incorporated by reference.

BACKGROUND OF THE INVENTION

1. Field of the Invention

This invention relates to light emitting devices comprising a base material or protective member having flexibility, light transmittance, weather resistance, heat resistance and electrical insulation as well as improved passivation, and more particularly, to organic EL devices using the same.

2. Description of the Background

Organic EL devices have a basic configuration including a hole injecting electrode of tin-doped indium oxide (ITO) etc., a hole transporting material such as triphenyldiamine deposited thereon, a light emitting layer of a fluorescent material such as aluminum quinolinol complex (Alq3) stacked thereon, and an electrode (electron injecting electrode) of a metal having a low work function such as Mg. The devices produce a very high luminance of several 100 to several 10,000 $cd/m^2$ when driven at a voltage of about 10 volts.

For the application of such organic EL devices to portable equipment, flexible materials such as resin film are of interest as the device base material. When highly heat resistant films such as polyimide and aramid films are used as the flexible base material, there may arise a problem that since these films are hydrophilic, outgassing due to water or moisture absorption of the films causes degradation of electrode materials and thin films such as EL film. Additionally, thin film laminates including the base material can be curled, bowed or waved. Detrimental effects are exerted on dimensional factors such as a thermal shrinkage factor and a coefficient of linear expansion and deformation.

Meanwhile, in order that organic EL devices find use as a display, their application to a color display of producing three primary colors of blue, green and red using a fluorescence conversion layer of fluorescent material and/or color filter layers is under study.

A method of constructing a color display by combining a single light emitting layer with a fluorescence conversion layer of fluorescent material and/or color filter layers is not only simple and inexpensive because only a single organic EL device is needed, but also advantageous in that a full-color display can be arrived at by forming the fluorescence conversion layer and/or the color filter layers in a desired pattern.

However, to form the fluorescence conversion layer and/or the color filter layers on the organic EL structure in a desired pattern is very difficult from the standpoints of patterning technique and damages to the organic EL structure. In an alternative wherein the fluorescence conversion layer and/or the color filter layers are formed on a substrate in a desired pattern and the organic EL structure is laid thereon, steps resulting from the patterning cause breaks or discontinuities of the overlying film or disconnection of wiring strips, which inhibits current flow with a failure to operate as an organic EL device. Another problem is that moisture and gases emanating from the fluorescence conversion layer and/or the color filter layers can damage organic layers and electrodes and corrode the electrodes.

One approach for solving these problems is to form an overcoat layer on the fluorescence conversion layer and/or the color filter layer. This approach yet leaves unsolved the problem that moisture and gases can damage organic layers and electrodes and corrode the electrodes.

Many attempts have been made to form a passivation film. These attempts are impractical for some reason or other that the moisture or gas impermeable effect of the film is insufficient, the surface flatness thereof is problematic, and the fluorescence conversion layer and/or the color filter layer or the overcoat layer serving as the underlying layer can be damaged by the conditions during formation of the passivation film.

When a passivation film is deposited by a vacuum process, the above problems may be overcome by increasing the thickness of the passivation film. However, a thick passivation film takes a long time to deposit and is poorly productive. An additional problem is that the film produced by the dry process has considerable internal stresses so that it may be readily cracked, failing to exert the passivation effect.

SUMMARY OF THE INVENTION

An object of the invention is to provide a light emitting device comprising a base material or protective member which has improved light transmittance, heat resistance, passivation (gas barrier, oligomer release prevention and minimized outgassing), anti-water or moisture-absorption, stability against chemical degradation, dimensional and shape stability, anti-surface-reflection, electrical insulation, UV degradation resistance, and weather resistance, and is highly productive due to possible film formation under atmospheric pressure, and hence, a light emitting device featuring high reliability, ease of manufacture and low cost.

This and other objects are achieved by the invention which is defined below.

(1) A light emitting device comprising a base material having at least light transparency and heat resistance, a lower electrode having light transmittance, a light emitting layer, and an upper electrode formed on the base material, said device further comprising a silica film and/or a siliceous film which is formed on the substrate side as viewed from the light emitting layer or on opposite sides of the substrate by applying polysilazane and subjecting it to oxidative treatment.

(2) The light emitting device of above (1) wherein said base material is formed of a glass or resin material.

(3) The light emitting device of above (1) wherein the silica film and/or the siliceous film is disposed at least between said base material and said light emitting layer.

(4) The light emitting device of above (3) wherein TFT's are formed on said base material and the light emitting layer is disposed on the TFT's.

(5) The light emitting device of any one of above (1) to (4) wherein the silica film and/or the siliceous film is disposed at least on opposite sides of the substrate.

(6) The light emitting device of any one of above (1) to (5) wherein the silica film and/or the siliceous film has been subjected to oxidative treatment under heated and/or humidified conditions.

(7) The light emitting device of any one of above (1) to (6) wherein said polysilazane and/or a modified product thereof has a structural unit of the following structural formula:

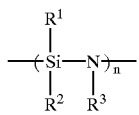

wherein $R^1$, $R^2$ and $R^3$ are alkyl groups, and at least one of $R^1$, $R^2$ and $R^3$ is a hydrogen atom.

(8) The light emitting device of above (7) wherein the total number of carbon atoms in the alkyl groups is up to 6.

(9) The light emitting device of (7) or (8) wherein said silica film and/or said siliceous film is obtained by converting a polysilazane having a number average molecular weight of 100 to 50,000 and/or a modified product thereof into a ceramic.

(10) The light emitting device of any one of above (1) to (9) which is an EL device.

In embodiment (1), a more stable $Si_3N_4$ film can be obtained by heat treatment in vacuum.

In embodiments (2) and (3), by forming a $SiO_xN_y$ film between a color filter and the transparent lower electrode, the device can be protected from outgassing from the color filter or the like.

In embodiments (4) and (5), gases emanating from the substrate can be blocked by the passivation film.

In embodiment (6), even a thick passivation film can be easily formed without using a vacuum chamber for sputtering or the like.

In embodiments (7), (8) and (9), the film becomes so flexible that no cracks occur in a film of 1.0 micron thick although cracks occur in a conventional film of even 0.5 micron thick. Among the alkyl groups, simple alkyl groups such as methyl are preferred.

DETAILED DESCRIPTION OF THE PREFERRED EMBODIMENTS

Figure 1:
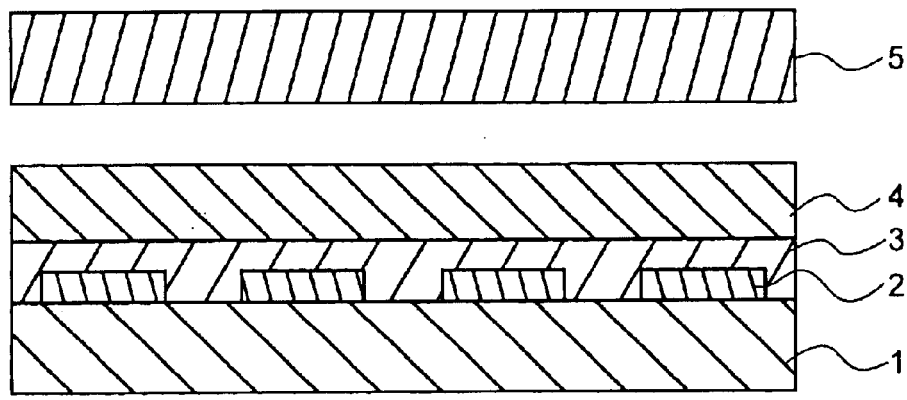
FIG. 1 is a schematic cross-sectional view showing the basic construction of an organic EL device embodying the light emitting device of the invention.

Now the invention is described in detail.

The light emitting device of the invention has a silica film on at least one surface of a base material, which is obtained by applying a coating solution of a polysilazane such as perhydropolysilazane in a solvent such as xylene to the base material, subjecting the coating to oxidation or steam oxidation, and separately or simultaneously or subsequently effecting heat treatment in air. The base material is constructed of a material such as a resin having light transmittance, heat resistance, and preferably flexibility, and may be present as a protective member (e.g., protective film) for coated structures such as various electronic devices or as a constituent member thereof, typically a substrate.

In an exemplary embodiment wherein a silica film as mentioned above is formed on a resin base material, improvements in many properties can be made while maintaining the flexibility inherent to the resin. Such improvements include an improvement in heat resistance, an improvement in surface flatness, maintenance or an improvement in light transmittance, an improvement in passivation of the base material, as well as improvements in anti-water or moisture-absorption, chemical degradation, dimensional or shape stability, UV or light degradation resistance and surface reflection reduction. These improvements cooperate to contribute to life extension and weather resistance. More specifically, water vapor or oxygen permeability becomes so low, preventing the light emitting device from being degraded in performance by water vapor or oxygen and ensuring a long lifetime. Also, a dense film thus obtained provides improved strength and good corrosion resistance. Since a flat film is obtained, not only it has light transparency, but also it does not become the factor of aggravating optical functions in the case of electronic devices such as light emitting devices. Also the adhesion of the silica film to the base material is satisfactory.

The film can also provide passivation between the base material or a functional film on the base material, for example, an optical functional film such as a filter and an overlying functional thin film such as an electrode layer or light emitting layer, thereby protecting the device constituting layers from water or gases released from the base material or the functional film on the base material.

The silica film is obtained by applying a coating solution of a polysilazane such as perhydropolysilazane and effecting steam oxidation and/or heat treatment (inclusive of drying treatment). This production method is advantageous in that a silica film can be formed on a generally low heat resistant resin base material under atmospheric pressure by a high-productivity processing technique such as wet coating. As compared with the techniques of forming silica film at low temperatures including CVD and PVD techniques, the above production method has the advantages of easy production, high productivity, and cost effectiveness because a film can be formed by coating under atmospheric pressure without a need for special units associated with a vacuum deposition chamber. Therefore, the silica film can be easily formed even on the base material having a filter layer already formed thereon and during the process, the underlying layer such as the filter layer is little damaged.

In the application where flexibility is not strictly required, glass may be used as the base material. The coating of soda glass with polysilazane prevents dissolution of $Na^+$ ions. Even when the coated glass is immersed in pure water at 100° C. for about 24 hours, the silica coat of polysilazane reduces the amount of $Na^+$ ions dissolved out to a level below 1.6 wt % comparable to alkali-free glass. As a result, the cost of substrate glass can be reduced. For example, by spin coating a 20% solution of polysilazane #L110 on soda-lime glass of 0.7 mm thick to a wet thickness of 1.5 μm, drying and heat treating in a $N_2$ atmosphere at 500° C. for one hour, contamination with ingredients from within the glass can be prevented. This suggests a possibility to substitute the coated glass for an expensive alkali-free substrate. It is ascertained that the barrier layer obtained herein has been locally converted into a $SiO_xN_y$ film having better barrier properties than a $SiO_2$ film, and more particularly, a mixed structure of $SiO_x$ and $SiN_y$ (oxygen-nitrogen ratio O/(O+N) is approximately 50 to 80%).

The flexible base materials used herein are preferably resin materials. Preferred are base materials of resins having a glass transition point Tg of at least 65° C. and/or a heat resistant temperature of at least 70° C., light transparency and heat resistance.

Examples of the resinous base material having light transparency and heat resistance include homopolymers such as polyethylene terephthalate film (Tg 69° C.), polyethylene naphthalate heat-resistant film (Tg 113° C.), chlorotrifluoroethylene resin (PCTFE, Neoflon CTFE by Daikin Industries Co., Ltd.) (heat resistant temperature 150° C.), polyvinylidene fluoride (PVDF, Denka DX film by Denki Kagaku Kogyo K.K.) (heat resistant temperature 150° C., Tg 50° C.), and polyvinyl fluoride (PVF, Tedlar PVF film by E. I. Dupont) (heat resistant temperature 100° C.); films of fluorinated copolymers such as tetrafluoroethylene-perfluorovinyl ether copolymer (PFA, Neoflon PFA film by Daikin Industries Co., Ltd.) (heat resistant temperature 260° C.), tetrafluoroethylene-hexafluoropropylene copolymer (FEP, Toyoflon Film FEP type by Toray Co., Ltd.) (heat resistant temperature 200° C.), tetrafluoroethylene-ethylene copolymer (ETFE, Tefzel ETFE film by E. I. Dupont) (heat resistant temperature 150° C.), and AFLEX film (Asahi Glass Co., Ltd., Tg 83° C.); copolymeric aromatic polyesters such as copolymers of an aromatic dicarboxylic acid (e.g., terephthalic acid/isophthalic acid) with a dihydric phenol such as bisphenol A (PAR casting, Elmeck by Kaneka Corp., heat resistant temperature 290° C., Tg 215° C.), polyarylate films (e.g., new PAR "MF series" MF-2000 by Unitika Ltd., Tg 288° C.); sulfurous polymer films such as polysulfone (PSF, Sumilite FS-1200 by Sumitomo Bakelite Co., Ltd., Tg 190° C.) and polyether sulfone (PES, Sumilite FS-5300 by Sumitomo Bakelite Co., Ltd., Tg 223° C.); polycarbonate film (PC, Panlite by Teijin Chemicals Co., Ltd., Tg 150° C.), composite ITO film/buffer film laminate heat resistant PC film (HT-60 by Teijin Ltd., Tg 205° C.); amorphous polyolefin resin (APO by Mitsui Chemical Co., Ltd.), cycloolefin resin (Zeonoa by Zeon Corp., Tg 105–163° C.), functional norbornene resin (ARTON by JSR, heat resistant temperature 164° C., Tg 171° C.), polycyclohexene (PCHE, Asahi Chemical Co., Ltd., Tg 218° C.), polymethacrylate resin (PMMA, by Mitsubishi Rayon Co., Ltd. and Sumitomo Chemical Co., Ltd., Tg 80–114° C.), olefin-maleimide copolymer (TI-160 by Toso Co., Ltd., Tg≧150° C.), para-aramid (Aramica R by Asahi Chemical Co., Ltd., heat resistant temperature 200° C.), fluorinated polyimide (heat resistant temperature≧200° C.), polystyrene (Tg 90° C.), polyvinyl chloride (Tg 70–80° C.), and cellulose triacetate (Tg 107° C.).

Depending on a particular purpose and application, any suitable one may be chosen from the foregoing resins. In particular, for environmental cleanness purposes, non-halogenated resins are preferred. For example, polyether sulfone (PES) resins having high transparency, heat resistance and dimensional stability, heat resistant polycarbonate resins, amorphous polyolefin resins (polycyclohexene (PCHE)), and aromatic polyester resins (e.g., polyarylate resins) are preferred. It is preferred to use these resins as at least a part of the base material. In particular, since hygroscopic resins are, of course, very sensitive and even EL light emitting films are sensitive to water vapor in outgassing components and moisture, the provision on at least one film surface thereof of a silica and/or siliceous passivation film obtained by low-temperature wet coating of polysilazane is effective for improving barrier properties to moisture, water vapor and gases such as $O_2$. For both continuous processing of a long, wide film and batchwise processing of film sections, this is effective from the economical standpoint too.

Also, a composite film for LCD obtained by coating a polycarbonate film on upper and lower surfaces with a gas barrier solvent-resistant layer and forming an ITO conductive film on one surface (Elclear HT-60 by Teijin Ltd.) is ready for use as the base material film.

The resin base material has a glass transition temperature Tg of at least 65° C., preferably at least 70° C., more preferably at least 180° C., especially at least 230° C., and its upper limit, though not critical, is generally about 350° C., preferably about 300° C., especially about 250° C. The resin base material has a heat resistant temperature or continuous service temperature of at least 80° C., preferably at least 160° C., especially at least 200° C., and its upper limit (the higher, the more preferable), though not critical, is generally about 250° C. However, as a package protective member for the device (for example, resin base material for laminate film), a resin base material having a heat resistant temperature of at least 80° C. can be used. The thickness of the resin base material is determined as appropriate in accordance with the intended purpose, application, required strength and flexural modulus, and is generally in the range of 5 to 150 μm, preferably 35 to 135 μm, when used as a protective member. In general, as the resin base material becomes thinner, its surface protecting effect becomes weaker. Inversely, if the resin base material is as thick as about 500 to 1,000 μm, there is a tendency for flexibility and light transmittance to decline. It is noted that for example, PES (optical grade, smoothened FS-1300 series by Sumitomo Bakelite Co., Ltd.) has a visible light transmittance of about 90% at a thickness of 50 μm, and this level of light transmittance is sufficiently acceptable for an EL device having a color filter formed on a substrate close to visual perception.

It is noted that light transparency means that at least 60%, preferably at least 70%, and more preferably at least 80% of light in the visible region (especially the light emission wavelength region of the device) is transmitted by the base material.

The resin base material preferably has a molecular orientation ratio (MOR), representing a degree of molecular orientation, of 1.0 to 3.0, more preferably 1.0 to 2.0, especially 1.0 to 1.8. MOR values within this range ensure that the coated structure is little deformed. The MOR value representative of a degree of molecular orientation is described in Convertech, March 1998, Shigeyoshi Osaki, "Quality Control of Film Sheets Using Microwave Molecular Orientation Meter" and Seikei-Kakou, Vol. 17, No. 11, 1995, Y. Zushi, T. Niwa, S. Hibi, S. Nagata, and T. Tani, "Molecular Orientation Behavior On Biaxial Stretching." Larger MOR values indicate greater anisotropy, with a MOR value of 1.0 indicating random orientation.

As to the degree of molecular orientation, a single resinous film may have different MOR values at different sites. Especially in the event of a biaxially stretched film, the film tends to exhibit a higher degree of molecular orientation at its edge where it has been secured during stretching. On account of this tendency, it is recommended that even when a film is made of a resin normally having a satisfactory degree of molecular orientation, the film should be examined for a degree of molecular orientation at several sites and confirmed to have degrees of molecular orientation within the desired range before it can be used in the invention.

Measurement of MOR is made, for example, by directing microwave to a rotating sample and measuring the intensity of transmitted microwave. More particularly, the interaction between the microwave electric field with a certain frequency and dipoles of the polymer is correlated to the inner product of their vectors. When the sample is rotated in the microwave polarization electric field, the intensity of transmitted microwave changes due to the anisotropy of dielectric constant, from which a degree of molecular orientation can be determined. The microwave used in this measurement is not critical although it usually has a frequency of 4 GHz or 12 GHz. The meter for measuring a degree of molecular orientation utilizing this principle is commercially available as molecular orientation meters MOA-5001A, 5012A, 3001A and 3012A from Shin-Oji Paper K.K. Alternatively, MOR values may be determined by x-ray diffraction, infrared dichroic, polarization fluoroscopic, ultrasonic, optical and NMR analyses.

The silica film coated on the base material, preferably resin base material, according to the invention is formed using a polysilazane and/or a partially minutely modified product thereof. The silica film preferably has a thickness of about 0.01 to 15 μm and more preferably about 0.1 to 10 μm. A film thickness within this range performs a full function as a protective film and can maintain flexibility in the application where flexibility is required. In contrast, too thin a film fails to fulfil the insulation required as a protective film or color filter overcoating film or the function as a heat resistant, surface leveling passivation film whereas too thick a film is likely to sacrifice flexibility in the application where flexibility is required.

A typical wet coating technique to form a silica film is a sol-gel technique, which requires firing in air near 450° C. in order to achieve substantially complete silica conversion as shown below, which entails a substantial weight loss due to elimination of hydroxyl and alkoxy groups and hence, a substantial volume shrinkage, causing cracks to occur in films having a thickness of at least 0.5 μm. However, the silica conversion process using polysilazane and/or a partially modified product thereof invites a weight increase upon silica conversion and hence, a minimal volume shrinkage on account of the reaction mechanism to be described later, so that the silica film conversion can be achieved at the temperature the resin can withstand and with a least likelihood of cracking.

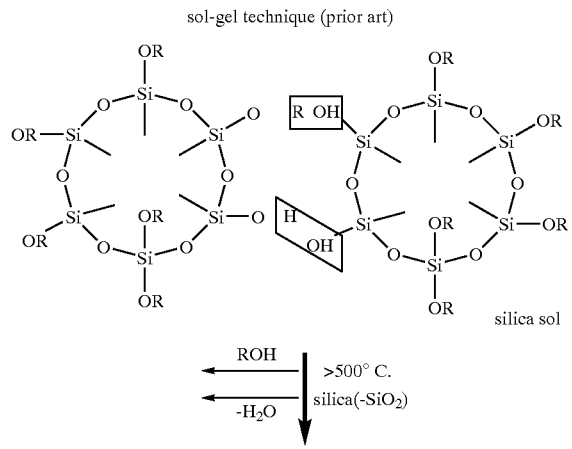

sol-gel technique (prior art)

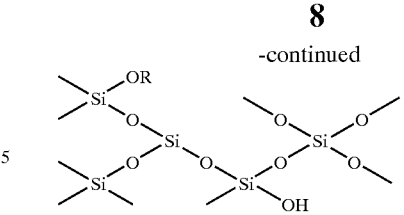

-continued

The polysilazane used in the invention is a polymer having silicon-nitrogen bonds as shown below, and more particularly, a precursor inorganic polymer comprising Si—N, Si—H, N—H and other bonds to ceramics such as $SiO_2$, $Si_3N_4$, and an intermediate solid solution $SiO_xN_y$ therebetween. Most often used is perhydropolysilazane in which all side chains are hydrogen. It is presumed that perhydropolysilazane possesses a structure having straight chain structures combined with ring structures including mainly 6 and 8-membered rings. It has a molecular weight of about 600 to 2,000 calculated as a number average molecular weight (Mn) using a polystyrene standard. It is either a liquid or a solid material depending on its molecular weight.

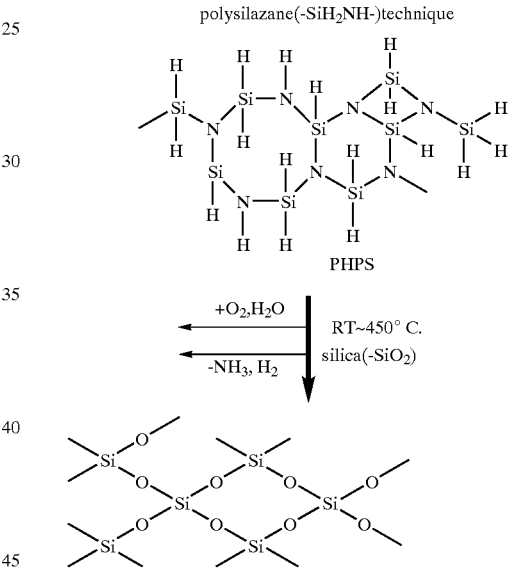

The polysilazane is commercially available as a solution in an organic solvent. The commercial product is ready for use as a polysilazane coating solution.

As the organic solvent, alcohol solvents which readily react with polysilazane are undesired. Illustratively, useful organic solvents include hydrocarbon solvents such as aliphatic hydrocarbons, alicyclic hydrocarbons and aromatic hydrocarbons; halogenated hydrocarbon solvents, and ethers such as aliphatic ethers and alicyclic ethers. Specifically, useful organic solvents include hydrocarbons such as pentane, hexane, isohexane, methylpentane, heptane, isoheptane, octane, isooctane, cyclopentane, methylcyclopentane, cyclohexane, methylcyclohexane, benzene, toluene, xylene and ethylbenzene; halogenated hydrocarbons such as methylene chloride, chloroform, carbon tetrachloride, bromoform, ethylene chloride, ethylidene chloride, trichloroethane, and tetrachloroethane; and ethers such as ethyl ether, isopropyl ether, ethyl butyl ether, butyl ether, dioxane, dimethyl dioxane, tetrahydrofuran, and tetrahydropyran.

On use, any of these solvents may be selected so as to adjust the solubility of polysilazane, the evaporation rate of solvent, and the concentration increase of the solution, and a mixture of two or more solvents may be used to meet a particular purpose.

The content of polysilazane in the polysilazane coating solution is about 0.2 to 35% by weight, though it varies with the desired thickness of silica film and the pot life of the solution.

The organic polysilazane may be a derivative thereof in which some hydrogen atoms attached to Si are substituted with alkyl groups or the like. The inclusion of alkyl groups, especially methyl groups having the lowest molecular weight improves the adhesion to the underlying material, endows a hard, brittle silica film with toughness, and prevents crack occurrence even when the film thickness is increased. The alkyl groups are preferably those of 1 to 4 carbon atoms, and the alkyl group of one carbon atom is especially preferred because of least reduction of the advantages inherent to silica, for example, improved purity of amorphous silica after silica conversion, passivation, outgassing by heat, and thermal expansion. However, depending on coating conditions, the tert-butyl group of 4 carbon atoms or the like may be used if it is desired to increase the viscosity of a non-aqueous solution or increase the thickness of silica film.

When polysilazane is represented by the formula:

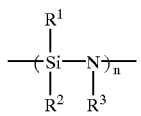

wherein $R^1$, $R^2$ and $R^3$ are alkyl groups, at least one of $R^1$, $R^2$ and $R^3$ is hydrogen, the degree of substitution with alkyl groups is preferably such that alkyl groups, especially methyl groups, substitute for up to 20%, more preferably up to 10%, and even more preferably 0.5 to 10% of the hydrogen atoms in the structural units.

The derivative having alkyl groups may also be used as an undercoat layer below the silica film of polysilazane. More specifically, a first layer serving as an undercoat is formed from a polysilazane derivative having alkyl groups, and a second layer is then formed from polysilazane, giving a two-layer structure. Such a two-layer structure is an effective means for enhancing affinity when a silica passivation layer is formed on a color filter of the structure wherein a glass substrate is provided with a patterned color filter layer using a color resist, and the color resist is optionally overcoated with a UV curable acrylic resin. Differently stated, the first layer is provided for enhancing affinity and the second layer having good passivation is formed thereon. Accordingly, the first layer need not be so thick as the ground-conditioning layer and its thickness may be equal to or less than the thickness of the second layer.

When only the first layer is provided for simplifying the process as means for improving productivity and yield and especially in combination with a glass substrate, it is recommended to use a polysilazane derivative having some hydrogen atoms substituted with alkyl groups because the limit film thickness can be increased. More specifically, the use of an alkyl-substituted derivative is effective for smoothening as an overcoat layer on the color filter layer, providing passivation of outgassing from the color filter by the converted silica film, and providing passivation against the migration of Na ions from an inexpensive blue glass substrate. Then no problems occur even when alkali-free glass is not used.

If necessary, a photo-polymerization initiator may be included. The inclusion of a photo-polymerization initiator promotes silica-forming reaction, especially when alkyl group sites of the undercoat or first layer are reactive double bonds such as alkylene groups, increasing the likelihood of forming a more dense silica film and enhancing the performance as the undercoat film upon formation of the second layer. By introducing the organic silazane into perhydropolysilazane to such an extent that the characteristics inherent to the inorganic polymer are not compromised, formation of a microscopic composite structure of inorganic filler ($SiO_2$) in the organic polymer is promoted. The organic silazane introduced also contributes to "thick film formation," "stability improvement," "film thickness limit expansion," and "flatness improvement," and promotes alloying due to high compatibility with acrylic resins or the like, which has been ascertained as the compatible inclusion of domains with a size of about 200 Å.

The photo-polymerization initiator may be selected from well-known ones. Commercial initiators which are easily available are preferred. A mixture of photo-polymerization initiators may also be used. Examples of the photo-polymerization initiator include arylketone photo-polymerization initiators (e.g., acetophenones, benzophenones, alkylaminobenzophenones, benzyls, benzoins, benzoin ethers, benzyl dimethyl ketals, benzoyl benzoates, and α-acyloxime esters), sulfurous photo-polymerization initiators (e.g., sulfides and thioxanthones), acylphosphine oxide photo-polymerization initiators, and the like. It is especially preferred to use acylphosphine oxide photo-polymerization initiators. The photo-polymerization initiator may also be used in combination with a photo-sensitizer such as amines. Illustrative examples of the photo-polymerization initiator are given below.

4-phenoxydichloroacetophenone, 4-t-butyl-dichloroacetophenone, 4-t-butyl-trichloroacetophenone, diethoxyacetophenone, 2-hydroxy-2-methyl-1-phenylpropan-1-one, 1-(4-isopropylphenyl)-2-hydroxy-2-methylpropan-1-one, 1-(4-dodecylphenyl)-2-methylpropan-1-one, 4-(2-hydroxyethoxy)phenyl(2-hydroxy-2-propyl) ketone, 1-hydroxycyclohexyl phenyl ketone, 2-methyl-1-{4-(methylthio)phenyl}-2-morpholinopropan-1-one, benzyl, benzoin, benzoin methyl ether, benzoin ethyl ether, benzoin isopropyl ether, benzoin isobutyl ether, benzyl dimethyl ketal, benzophenone, benzoylbenzoic acid, methyl benzoylbenzoate, 4-phenylbenzophenone, hydroxybenzophenone, acrylated benzophenone, 3,3'-dimethyl-4-methoxybenzophenone, 3,3',4,4'-tetrakis(t-butylperoxycarbonyl)benzophenone, 9,10-phenanthrene quinone, camphor quinone, dibenzosuberone, 2-ethylanthraquinone, 4',4''-diethylisophthalophenone, α-acyloxime ester, methyl phenylglyoxylate, 4-benzoyl-4'-methyldiphenyl sulfide, thioxanthone, 2-chlorothioxanthone, 2-methylthioxanthone, 2,4-dimethylthioxanthone, isopropylthioxanthone, 2,4-dichlorothioxanthone, 2,4-diethylthioxanthone, 2,4-diisopropylthioxanthone, 2,4,6-trimethylbenzoyldiphenyl-phosphine oxide, benzoyldiphenylphosphine oxide, 2,6-dimethylbenzoyldiphenylphosphine oxide, and bis(2,6-dimethoxybenzoyl)-2,4,4-trimethylpentylphosphine oxide.

The photo-polymerization initiator contributes little to conversion of inorganic polysilazane to silica and excessive amounts thereof detract from the denseness of converted silica film. Therefore, the photo-polymerization initiator is preferably contained in an amount of about 0.01 to 5% by weight of the coating solution and in the case of organic polysilazane, up to 20% by weight per 100 parts by weight of the UV curable resin component.

Also if necessary, a catalyst may be used for promoting the reaction. Of the catalysts, those capable of helping polysilazane cure at lower temperature are preferred. Exemplary catalysts are metal catalysts in the form of metal microparticulates such as gold, silver, palladium, platinum and nickel (JP-A 7-196986) and complexes thereof with carboxylic acids (JP-A 5-93275). Instead of adding the catalyst to the polysilazane solution, it is also preferable to contact a coated molding directly with a catalyst solution, specifically an aqueous amine solution or exposing a coated molding to a vapor thereof for a certain time, as proposed in JP-A 9-31333.

As mentioned above, polysilazane is a ceramic precursor polymer, and to form a silica film using polysilazane, firing in air at 450° C. or higher is necessary. However, by subjecting a coating of polysilazane in wet state to steam oxidation in the presence of a catalyst and/or thermal oxidation in an air atmosphere, a dense silica film can be formed even at a temperature below 100° C. and even on a less heat resistant substrate such as plastic film. In particular, a methyl-substituted polysilazane which permits to increase the film thickness limit above which cracks will occur is advantageous with respect to the efficiency of silica conversion by humidifying. Accordingly, for formation of the silica film, there may be employed any of heating, steam oxidation, and the combination of heating with steam oxidation and heating in an air atmosphere. In particular, a siliceous ceramic is formed by bringing a polysilazane coating solution (polysilazane's Mn 100 to 50,000) in gas phase contact with a vapor (gas phase) of a 5 wt % aqueous solution of trimethylamine as the catalyst at 25° C. for 2 minutes and holding it in an atmosphere of 95° C. and RH 80% for 5 minutes. This method enables to form a ceramic silica layer on a length of plastic film by continuous coating and curing.

Alternatively, a silica ceramic film is obtainable by heating a polysilazane having a Mn of 100 to 50,000 and an acetylacetonato complex (Ni, Pt, Pd, Al, Rh, etc.) for reaction to form a complex-added polysilazane fluid having a glycidol/polysilazane atomic ratio in the range of $1.0 \times 10^{-6}$ to 2 and a Mn of about 200 to 500,000 and firing the fluid at a low temperature of 50 to 350° C.; or by adding a metal (Ag, Au, Pd, Ni, etc.) with a size of less than 0.5 $\mu$m to a polysilazane having a Mn of 100 to 50,000 and firing the polysilazane at a low temperature of 150 to 370° C. In these embodiments, by firing the silica ceramic film in a $N_2$ or $NH_3$-containing atmosphere at a temperature above 250° C., it is converted to a partially silicon nitrided film which is close to $SiO_xN$ or $SiN_y$ layer, though somewhat deviating from the stoichiometry ($SiO_xN_y$, O/(O+N) is about 50 to 80%). Enhanced passivation is achieved even with a relatively thin layer.

Further, a silicon nitrided film as described in JP-A 10-194873 may be used. Specifically, a dense silicon nitride film of 0.1 $\mu$m thick having better passivation is obtainable by coating a 20 wt % xylene solution of a modified polysilazane having a Mn of 500 to 10,000 obtained by dehydrogenating condensation of polysilazane using ammonia or hydrazine, to a thickness of 0.3 $\mu$m by means of a spin coater, drying the coating on a hot plate (100° C.), and baking in a vacuum heating furnace in a vacuum of 0.001 Pa at 600° C. for 30 minutes.

The means of coating the polysilazane solution is not critical and any of well-known and conventional methods may be used. Useful methods are, for example, dipping, flow coating, spraying, bar coating, gravure coating, roll coating, blade coating, air knife coating, spin coating, slit coating and micro-gravure coating methods. After coating, if the coating composition contains a solvent, the coating is dried to remove the solvent. In the case of an organic polysilazane-containing system, the coating is then cured by irradiating UV radiation if necessary, or by heating or by allowing to stand at room temperature. It is possible to promote curing by contacting with an aqueous solution of an amine or acid or a vapor thereof.

It is noted that the wet film thickness is about 20 to 30% thicker than the final film thickness.

Especially in the case of an organic polysilazane containing an acrylic resin having ethylenically unsaturated double bonds, actinic energy rays such as UV and electron beams may be irradiated upon formation of the silica film. Particularly when the coating contains a photo-polymerization initiator, radiation of a wavelength necessary to excite the photo-polymerization initiator, for example, UV radiation must be irradiated. Even when the coating does not contain a photo-polymerization initiator, irradiation of electron beams can promote reaction to facilitate formation of a dense silica film hybridized with organic polymer.

The preferred actinic energy ray used for the curing of polysilazane is UV radiation. However, the radiation is not limited to UV, and electron beams and other actinic energy rays may be used. The UV sources which can be used herein include xenon lamps, pulse xenon lamps, low-pressure mercury lamps, high-pressure mercury lamps, ultrahigh-pressure mercury lamps, metal halide lamps, carbon arc lamps, and tungsten lamps.

Further, a plasma treatment may be carried out during and/or after formation of the silica film. The plasma treatment subjects the surface to ashing or cleaning and ensures formation of a silica film closer to the stoichiometry. The preferred plasma treatment is $O_2$ plasma treatment.

The silica film of the invention may have an undercoat layer for improving its adhesion to the substrate, fluorescent substance-containing fluorescence conversion layer, color filter layer or coating layer.

The undercoat layer is not critical as long as it has light transparency, insulation and heat resistance and is well adherent to the substrate, fluorescent substance-containing fluorescence conversion layer, color filter layer or coating layer. The preferred undercoat layer is a hybrid organic-inorganic resin layer interconnected through covalent bonds or a resin layer fully loaded with microparticulates.

Examples of the hybrid organic-inorganic resin layer interconnected through covalent bonds are given below.

(1) A composition is obtained by adding 10 g of urethane acrylate (containing on the average 15 acryloyl groups per molecule) and 15 g of a xylene solution of perhydropolysilazane (solids 20% by weight, number average molecular weight Mn=approx. 1,000, Tonen Corp., trade name L110), and agitating at room temperature for about one hour. Note that the urethane acrylate is a solution of 150 mg of 2,4,6-trimethylbenzoyldiphenylphosphine oxide as a photo-polymerization initiator, 1000 mg of 2-hydroxy-5-(2-acryloyloxyethyl)phenylbenzotriazole as a UV absorber, and 200 mg of bis(1-octyloxy-2,2,6,6-tetramethyl-4-piperidyl) sebacate as a photo-stabilizer in 30 g of butyl acetate. The composition is coated to a thickness of several microns using a doctor blade or the like, dried to remove the solvent, and irradiated in an air atmosphere with UV at a dose of 3,000 mJ/cm$^2$ and a wavelength of 300 to 390 nm using a high-pressure mercury lamp, yielding a transparent cured coating.

(2) UV/EB curing type resins for optical members (Z series) by JSR Corp. Typically, an organic solvent solution of a hybrid organic/inorganic material obtained by introducing photosensitive acryloyl groups into $SiO_2$ particles having a smaller particle diameter of 0.01 µm (10 nm) than the wavelength of visible light, for example, Desolite Z7500 series (Z7501, Z7503, KZ71714) is spin coated, dried and cured with UV at 1.0 J/cm², yielding a resin layer.

(3) A thermosetting hybrid organic-inorganic resin of zirconia-modified polysilsesquioxane (trade name ZRS by Shokubai Kasei K.K., a partially Zr substituted ladder structure-like polymer of SiO skeleton having ring structure side chains having R— and RO— groups).

After any one of the undercoat layers (1), (2) and (3) is formed, oxygen plasma treatment is carried out whereby the undercoat layer is converted to be nearly siliceous. When the polysilazane conversion layer is formed on the undercoat layer, coverage is improved due to ameliorated affinity at the interface therebetween, and the undercoat layer exerts its passivation improving effect extra.

The resin layer fully loaded with microparticulates preferably uses as the resin component, one or more of UV/EB curable or organic peroxide curable resins having acrylic double bonds, thermosetting resins which are thermally curable through ring opening polymerization of epoxy rings, resins co-condensed with alkoxysilyl group-bearing acrylic resins using an aluminum chelate compound as a condensation catalyst, and transparent polyurethane resins in which non-yellowing isocyanate group-bearing urethane polymers are condensed with hydroxyacrylate resins or polyester or polyether (polyether type hydroxyl group-bearing polyol) prepolymers. Examples of the microparticulates to be loaded in the resin include $SiO_2$, $Al_2O_3$, $ZrO_2$, $Ce_2O_3$, $SiO$, $SiO_xN_y$, and $Si_3N_4$. Of these, $SiO_2$ microparticulates and $SiO_xN_y$ microparticulates are especially preferred. The microparticulates preferably have an average primary particle diameter of about 0.005 to 1.0 µm.

Preferably these undercoat layers have a thickness of about 0.05 to 10 µm.

When the silica film of the invention is formed directly on a color filter layer, fluorescence conversion layer or the like, satisfactory flatness is obtainable without a need for an overcoat layer. The surface roughness achievable herein is an Rmax within 30 nm.

Preferably the silica film has a transmittance to emitted light of at least 60%, more preferably at least 70% and especially at least 80%. If the transmittance is low, the silica film tends to attenuate the light emission from the light emitting layer, failing to reach the luminance level necessary as the light emitting device.

In another embodiment wherein UV-absorbing inorganic microparticulates, preferably zinc oxide (ZnO) microparticulates are incorporated in the silica film, the microparticulates are added to the coating solution. The microparticulates preferably have an average particle diameter of 0.01 to 0.5 µm and are contained in an amount of about 25 to 35% by volume of the polysilazane.

ZnO is a non-pollutant unlike inorganic semiconductor particles such as CdS, and has lasting durability in various environments as compared with organic particles. Besides, some addenda are preferred as organic UV absorbers. Preferred addenda are polymer type addenda based on polymers combined with reactive UV absorbers.

For example, reactive UV absorbers of the following structure are included and commercially available as RUVA-93 (Otsuka Chemical Co., Ltd.).

They are also commercially available as copolymers with MMA and styrene. Examples include PUVA-30M and PUVA-30S (both by Otsuka Chemical Co., Ltd.), and for special purposes, PUVA-30M-30T, PUVA-50MBA-30T and PUVA-50MEH are also commercially available from Otsuka Chemical Co., Ltd.

These organic UV absorbers are laid on or under the silica film and their film thickness is about 1 to 15 µm.

Other UV absorbers which can be used herein include organic compounds and organic metal complex molecules capable of converting UV long wavelength fluorescence. Useful such compounds are rare earth planar complexes such as $[Tb(bpy)_2]Cl_3.xH_2O$ wherein bpy is 2,2'-bipyridine and $[Tb(phen)_2]Cl_3.xH_2O$ wherein phen is 1,10-phenanthroline, and symmetric dicyanopyrazine derivatives of the following structure.

As mentioned above, polysilazane is a ceramic precursor polymer. To form a silica film using polysilazane, firing in air at 450° C. or higher is necessary. However, by subjecting a coating of polysilazane in wet state to a combination of oxidation and steam oxidation in the presence of a catalyst, a dense silica film can be formed even at a temperature below 100° C. and even on a less heat resistant substrate such as plastic film. In particular, a siliceous ceramic is formed by bringing a polysilazane coating solution in gas phase contact with a vapor (gas phase) of a 5 wt % aqueous solution of trimethylamine as the catalyst at 25° C. for 2 minutes and holding it in an atmosphere of 95° C. and RH 80% for 5 minutes. This method enables to form a ceramic silica layer on a length of plastic film by continuous coating and curing. Alternatively, a silica ceramic film is obtainable by heating a polysilazane having a Mn of 100 to 50,000 and an acetylacetonato complex (Ni, Pt, Pd, Al, Rh, etc.) for reaction to form a complex-added polysilazane fluid having a glycidol/polysilazane atomic ratio in the range of $1.0 \times 10^{-6}$ to 2 and a Mn of about 200 to 500,000 and firing the fluid at a low temperature of 50 to 350° C.; or by adding a metal (Ag, Au, Pd, Ni, etc.) with a size of less than 0.5 µm to a polysilazane having a Mn of 100 to 50,000 and firing the polysilazane at a low temperature of 150 to 370° C. Respective steps are carried out in a well-known manner.

It is noted that the wet film thickness is about 20 to 30% thicker than the final film thickness.

As mentioned above, the light emitting device having a silica film on a resinous base material according to the invention may consist of a resinous base material and a silica film. In another embodiment, the device has a resinous base material and a silica film serving as a protective member, antireflection film or constituent member. In a further embodiment, the device has a base material, an undercoat layer formed on the base material and having any desired function, and a silica film serving as a passivation member for any functional film to be formed thereon.

In the application where the light emission life of an EL device is not so strictly required, it is effective, for improving the reliability of EL devices, to use a fluoro-resins film having high water vapor barrier properties such as polyvinylidene fluoride, ETFE or PCTFE (surface subjected to CS treatment by Asahi Glass method), or a partially methyl-substituted polysilazane (thickness 1 µm or greater) converted, minute methyl group-bearing silica film as a package film, and especially, as a package film enclosing the overall flexible EL device using a film base material.

FIG. 1 illustrates one exemplary construction of a color display using the light emitting device of the invention. The color display shown in FIG. 1 has stacked in order, a substrate 1, a fluorescence conversion layer containing a fluorescent material and/or a color filter layer 2, a barrier layer 3, and a light emitting device structure 4 including an electron injecting electrode, a hole injecting electrode, a light emitting layer, etc. The fluorescence conversion layer and/or color filter layer may be two or more layers, if necessary. Also, if necessary, the color display may have a sealing member 5 for sealing the light emitting device structure 4.

The light emitting device of the invention is preferably configured such that emitted light exits from the substrate side through the fluorescence conversion layer and/or color filter layer.

Organic EL Device

The organic EL structure preferred as a light emitting device structure is generally configured to have a hole injection electrode (positive electrode) of ITO etc. as a first electrode, organic layers such as a hole injecting and transporting layer, a light emitting layer, and an electron injecting and transporting layer, and an electron injecting electrode (negative electrode) stacked in order. The structure may further has a color filter layer, a fluorescence conversion layer, and an overcoat layer as the underlay.

The color filter layer may be a color filter used in liquid crystal displays. The properties of a color filter are adjusted so as to match with the light emission of the organic EL device for thereby optimizing extraction efficiency and color purity. The spectra of light to be cut off is light with a wavelength of 560 nm or more and light with a wavelength of 480 nm or less in the case of green light, and light with a wavelength of 490 nm or more in the case of blue light, and light with a wavelength of 580 nm or less in the case of red light. Using such color filters, adjustment is preferably made to the NTSC standards or the chromaticity coordinates of the current CRT. The chromaticity coordinates can be measured using an ordinary chromaticity coordinate meter, for example, BM-7 or SR-1 by Topcon. The color filter layer may have a thickness of about 0.5 to 20 $\mu$m.

An optical thin film such as a multilayer dielectric film may be used instead of the color filter.

The fluorescence conversion layer is to convert the color of light emission by absorbing electroluminescence and allowing the phosphor in the layer to emit light. It is formed from three components: a binder, a fluorescent material, and a light absorbing material.

The fluorescent material used may basically have a high fluorescent quantum yield and desirably exhibits strong absorption in the EL emission wavelength region. More particularly, a fluorescent material producing a fluorescence spectrum having a maximum wavelength $\lambda$max of 580 to 630 nm is preferred. In practice, laser dyes are appropriate. Use may be made of rhodamine compounds, perylene compounds, cyanine compounds, phthalocyanine compounds (including sub-phthalocyanines), naphthalimide compounds, fused ring hydrocarbon compounds, fused heterocyclic compounds, and styryl compounds.

The binder is selected from materials which do not cause extinction of fluorescence, preferably those materials which can be finely patterned by photolithography or printing technique. Also, those materials which are not damaged during deposition of ITO or IZO as the positive electrode are preferable.

The light absorbing material is used when the light absorption of the fluorescent material is short and may be omitted if unnecessary. The light absorbing material may also be selected from materials which do not cause extinction of fluorescence of the fluorescent material.

Using such a fluorescence conversion layer, preferred x and y values in the CIE chromaticity coordinates are obtainable. The fluorescence conversion layer may have a thickness of about 0.5 to 20 $\mu$m.

The overcoat layer is not necessarily needed in the invention. The silica film formed directly on the color filter layer and fluorescence conversion layer can serve the function of an overcoat layer. When the overcoat layer is formed as required, thermosetting resins and UV-curable resins are preferred. Of these, thermosetting resins are especially preferred because the surface of an organic layer is leveled out by the heat applied for curing. Inter alia, polysilsesquioxane resins (ladder silicone resins) and acrylic resins are especially preferred. These resins may be used alone or in admixture of two or more. The overcoat layer is generally formed by coating the resin onto the substrate, fluorescence conversion layer and/or color filter layer, and effecting heat or UV curing. Conventional thermosetting resins cure at a temperature of about 140 to 180° C. In the case of UV curable resins, UV radiation is generally irradiated to give an integral dose of 1,000 to 10,000 mJ.

Where a color filter for liquid crystal displays is used herein instead, its surface roughness should be Rmax 30 nm or less as measured by atomic force microscope (AFM). Concave or convex defects in large excess of 30 nm should not be included even if they are sparsely distributed. It is effective as means for preventing "black spots," "shorts" and other image quality defectives to form a surface leveling overcoat layer having a thickness of at least 1 $\mu$m as mentioned above so as to avoid such large protrusions.

Next described is an organic EL structure which is preferred as the light emitting device of the invention. The organic EL structure is generally laid on the silica film as shown in FIG. 1. One exemplary construction takes the form of a layered structure including a positive electrode in the form of a transparent electrode, a hole injecting and transporting layer, a light emitting layer, an electron injecting and transporting layer, and a negative electrode stacked in order.

The organic EL structure of the invention is not limited to the above embodiment, and various other constructions are possible. For example, the electron injecting and transporting layer may be omitted or integrated with the light emitting layer, or the hole injecting and transporting layer be mixed with the light emitting layer. Also, the light emitting layer may be composed of two or more layers.

The negative and positive electrodes can be formed by evaporating and sputtering techniques, and organic layers such as the light emitting layer be formed by vacuum evaporation or the like. If necessary, these films may be patterned by mask evaporation or etching following film formation whereby the desired pattern of light emission is obtainable.

Next, the organic layers in the organic EL device of the invention are described.

The organic layers include the light emitting layer. The light emitting layer is composed of stacked thin films of one or more organic compounds participating in at least the light emitting function.

The light emitting layer has functions of injecting holes and electrons, transporting them, and recombining holes and electrons to create excitons. The use of relatively electronically neutral compounds in the light emitting layer enables easy and well-balanced injection and transportation of electrons and holes.

If necessary, the light emitting layer may further include a hole injecting and transporting layer, an electron injecting and transporting layer and the like in addition to the light emitting layer in a strictly defined sense.

The hole injecting and transporting layer has functions of facilitating injection of holes from the hole injecting electrode, transporting them stably, and blocking electrons.

The electron injecting and transporting layer has functions of facilitating injection of electrons from the electron injecting electrode, transporting them stably, and blocking holes. These layers are effective for increasing the number of holes and electrons injected into the light emitting layer and confining holes and electrons therein for optimizing the recombination region to improve light emission efficiency.

The thicknesses of the light emitting layer, hole injecting and transporting layer, and electron injecting and transporting layer are not critical and vary with a particular formation technique. Usually a single layer is about 5 to 500 nm thick, especially about 10 to 300 nm thick.

The thicknesses of the hole injecting and transporting layer and electron injecting and transporting layer are equal to or range from 1/10 to 10 times the thickness of the light emitting layer although they depend on the design of a recombination/light emitting region. When the electron or hole injecting and transporting layer is divided into an injecting layer and a transporting layer, preferably the injecting layer is at least 1 nm thick and the transporting layer is at least 1 nm thick. The upper limit of thickness is generally about 500 nm for the injecting layer and about 500 nm for the transporting layer. The same applies when two injecting and transporting layers are provided.

The light emitting layer of the organic EL device contains a fluorescent material that is a compound having a light emitting capability. The fluorescent material may be at least one member selected from compounds as disclosed, for example, in JP-A 63-264692, such as quinacridone, rubrene, and styryl dyes. Also, quinoline derivatives such as metal complex dyes having 8-quinolinol or a derivative thereof as the ligand such as tris(8-quinolinolato)aluminum are included as well as tetraphenylbutadiene, anthracene, perylene, coronene, and 12-phthaloperinone derivatives. Further useful are the phenylanthracene derivatives described in JP-A 8-12600 and the tetraarylethene derivatives described in JP-A 8-12969.

It is preferred to use such a compound in combination with a host material capable of light emission by itself, that is, to use the compound as a dopant. In this embodiment, the content of the compound in the light emitting layer is preferably 0.01 to 10% by volume, especially 0.1 to 5% by volume. In the case of rubrene compounds, the preferred content is 0.01 to 20% by volume. By using the compound in combination with the host material, the light emission wavelength of the host material can be altered, allowing light emission to be shifted to a longer wavelength and improving the luminous efficiency and stability of the device.

As the host material, quinolinolato complexes are preferable, with aluminum complexes having 8-quinolinol or a derivative thereof as the ligand being more preferable. These aluminum complexes are disclosed in JP-A 63-264692, 3-255190, 5-70773, 5-258859 and 6-215874.

Illustrative examples include tris(8-quinolinolato)-aluminum, bis(8-quinolinolato)magnesium, bis(benzo{f}-8-quinolinolato)zinc, bis(2-methyl-8-quinolinolato)aluminum oxide, tris(8-quinolinolato)indium, tris(5-methyl-8-quinolinolato)aluminum, 8-quinolinolatolithium, tris(5-chloro-8-quinolinolato)gallium, bis(5-chloro-8-quinolinolato)calcium, 5,7-dichloro-8-quinolinolatoaluminum, tris(5,7-dibromo-8-hydroxyquinolinolato)aluminum, and poly[zinc(II)-bis(8-hydroxy-5-quinolinyl)methane].

Also useful are aluminum complexes having another ligand in addition to 8-quinolinol or a derivative thereof. Examples include bis(2-methyl-8-quinolinolato) (phenolato)-aluminum(III), bis(2-methyl-8-quinolinolato) (ortho-cresolato)aluminum(III), bis(2-methyl-8-quinolinolato)-(meta-cresolato)aluminum(III), bis(2-methyl-8-quinolinolato)(para-cresolato)aluminum(III), bis (2-methyl-8-quinolinolato)(ortho-phenylphenolato) aluminum(III), bis(2-methyl-8-quinolinolato)(meta-phenylphenolato)aluminum(III), bis(2-methyl-8-quinolinolato)(para-phenylphenolato)aluminum(III), bis(2-methyl-8-quinolinolato)(2,3-dimethylphenolato)aluminum (III), bis(2-methyl-8-quinolinolato)(2,6-dimethylphenolato) aluminum(III), bis(2-methyl-8-quinolinolato)(3,4-dimethylphenolato)-aluminum(III), bis(2-methyl-8-quinolinolato)(3,5-dimethylphenolato)aluminum(III), bis(2-methyl-8-quinolinolato)(3,5-di-tert-butylphenolato) aluminum(III), bis(2-methyl-8-quinolinolato)(2,6-diphenyl-phenolato)aluminum(III), bis(2-methyl-8-quinolinolato)-(2,4,6-triphenylphenolato)aluminum(III), bis(2-methyl-8-quinolinolato)(2,3,6-trimethylphenolato)aluminum(III), bis (2-methyl-8-quinolinolato)(2,3,5,6-tetramethyl-phenolato) aluminum(III), bis(2-methyl-8-quinolinolato)(1-naphtholato)aluminum(III), bis(2-methyl-8-quinolinolato) (2-naphtholato)aluminum(III), bis(2,4-dimethyl-8-quinolinolato)(ortho-phenylphenolato)aluminum(III), bis(2, 4-dimethyl-8-quinolinolato)(para-phenylphenolato)-aluminum(III), bis(2,4-dimethyl-8-quinolinolato)(meta-phenylphenolato)aluminum(III), bis(2,4-dimethyl-8-quinolinolato)(3,5-dimethylphenolato)aluminum(III), bis(2, 4-dimethyl-8-quinolinolato)(3,5-di-tert-butylphenolato) aluminum(III), bis(2-methyl-4-ethyl-8-quinolinolato)(para-cresolato)aluminum(III), bis(2-methyl-4-methoxy-8-quinolinolato)(para-phenylphenolato)aluminum(III), bis(2-methyl-5-cyano-8-quinolinolato)(ortho-cresolato)aluminum (III), and bis(2-methyl-6-trifluoromethyl-8-quinolinolato) (2-naphtholato)aluminum(III).

Also acceptable are bis(2-methyl-8-quinolinolato)-aluminum(III)-$\mu$-oxo-bis(2-methyl-8-quinolinolato) aluminum(III), bis(2,4-dimethyl-8-quinolinolato)aluminum (III)-$\mu$-oxo-bis(2,4-dimethyl-8-quinolinolato)aluminum (III), bis(4-ethyl-2-methyl-8-quinolinolato)aluminum(III)-$\mu$-oxo-bis(4-ethyl-2-methyl-8-quinolinolato)aluminum(III), bis(2-methyl-4-methoxyquinolinolato)aluminum(III)-$\mu$-oxo-bis(2-methyl-4-methoxyquinolinolato)aluminum(III), bis(5-cyano-2-methyl-8-quinolinolato)aluminum(III)-$\mu$-oxo-bis(5-cyano-2-methyl-8-quinolinolato)aluminum(III), and bis(2-methyl-5-trifluoromethyl-8-quinolinolato) aluminum(III)-$\mu$-oxo-bis(2-methyl-5-trifluoromethyl-8-quinolinolato)aluminum(III).

Other useful host materials are the phenylanthracene deriva tives described in JP-A 8-12600 and the tetraarylethene derivatives described in JP-A 8-12969.

The light emitting layer may also serve as the electron transporting layer. In this case, tris(8-quinolinolato) aluminum etc. are preferably used. These fluorescent materials may be evaporated.

Also, if necessary, the light emitting layer may be a layer of a mixture of at least one hole injecting and transporting compound and at least one electron injecting and transporting compound, in which a dopant is preferably contained. In such a mix layer, the content of the dopant is preferably 0.01 to 20% by volume, especially 0.1 to 15% by volume.

In the mix layer, carrier hopping conduction paths are created, allowing carriers to move through a polarly predominant material while injection of carriers of opposite polarity is rather inhibited, and the organic compound becomes less susceptible to damage, resulting in the advantage of an extended device life. By incorporating the aforementioned dopant in such a mix layer, the light emission wavelength the mix layer itself possesses can be altered, allowing light emission to be shifted to a longer wavelength and improving the luminous intensity and stability of the device.

The hole injecting and transporting compound and electron injecting and transporting compound used in the mix layer may be selected from compounds for the hole injecting and transporting layer and compounds for the electron injecting and transporting layer to be described later, respectively.

The electron injecting and transporting compound is preferably selected from quinoline derivatives and metal complexes having 8-quinolinol or a derivative thereof as a ligand, especially tris(8-quinolinolato)aluminum (Alq3). The aforementioned phenylanthracene derivatives and tetraarylethene derivatives are also preferable.

The compound for the hole injecting and transporting layer is preferably selected from amine derivatives having strong fluorescence, for example, triphenyldiamine derivatives, styrylamine derivatives and amine derivatives having an aromatic fused ring.

The mix ratio is preferably determined in accordance with the carrier density and carrier mobility. It is usually preferred that the weight ratio of the hole injecting and transporting compound to the electron injecting and transporting compound range from about 1/99 to about 99/1, more preferably from about 10/90 to about 90/10, especially from about 20/80 to about 80/20.

Also preferably, the thickness of the mix layer ranges from the thickness of a mono-molecular layer to less than the thickness of the organic compound layer, specifically from 1 to 100 nm, more preferably 5 to 60 nm, especially 5 to 50 nm.

Preferably the mix layer is formed by a co-deposition process of evaporating the compounds from distinct sources. If both the compounds have approximately equal or very close vapor pressures or evaporation temperatures, they may be pre-mixed in a common evaporation boat, from which they are evaporated together. The mix layer is preferably a uniform mixture of both the compounds although the compounds can be present in island form. The light emitting layer is generally formed to a predetermined thickness by evaporating an organic fluorescent material or coating a dispersion thereof in a resin binder.

In the hole injecting and transporting layer, there may be used various organic compounds as described, for example, in JP-A 63-295695, 2-191694, 3-792, 5–234681, 5-239455, 5-299174, 7-126225, 7-126226, and 8-100172, and EP 0650955A1. Exemplary are tetraarylbenzidine compounds (triaryldiamines or triphenyldiamines: TPD), aromatic tertiary amines, hydrazone derivatives, carbazole derivatives, triazole derivatives, imidazole derivatives, oxadiazole derivatives having an amino group, and polythiophenes. Two or more of these compounds may be used, and on such combined use, they may be formed as separate layers or mixed.

The electron injecting and transporting compound which can be used herein include quinoline derivatives including organic metal complexes having 8-quinolinol or a derivative thereof as a ligand such as tris(8-quinolinolato)aluminum (Alq3), oxadiazole derivatives, perylene derivatives, pyridine derivatives, pyrimidine derivatives, quinoxaline derivatives, diphenylquinone derivatives, and nitro-substituted fluorene derivatives.

In forming the light emitting layer, the hole injecting and transporting layer, and the electron injecting and transporting layer, vacuum evaporation is preferably used because homogeneous thin films are available. By utilizing vacuum evaporation, there is obtained a homogeneous thin film which is amorphous or has a crystal grain size of less than 0.2 $\mu$m. If the grain size is more than 0.2 $\mu$m, uneven light emission would take place and the drive voltage of the device must be increased with a substantial drop of charge injection efficiency.

The conditions for vacuum evaporation are not critical although a vacuum of $10^{-4}$ Pa or lower and a deposition rate of about 0.01 to 1 nm/sec are preferred. It is preferred to successively form layers in vacuum because the successive formation in vacuum can avoid adsorption of impurities on the interface between the layers, thus ensuring better performance. Also, the drive voltage of a device can be reduced and the development and growth of dark spots be restrained.

In the embodiment wherein the respective layers are formed by vacuum evaporation, where it is desired for a single layer to contain two or more compounds, boats having the compounds received therein are individually temperature controlled to achieve co-deposition.

In the practice of the invention, each of the organic layers may be formed by a coating technique. When the organic layers are formed by the coating technique, the device can be fabricated in a simpler manner, leading to an improved production efficiency and reduced cost. In one preferred method, R, G and B light emitting layers having a reduced thickness of about 30 to 100 nm are separately coated in stripes of about 100 $\mu$m wide at a pitch of 100 $\mu$m, using the micro-gravure coating technique, and roll-to-roll printing is enabled using the aforementioned flexible barrier film as the base material, and to this end, a precise coating precision control is employed.

Examples of well-known high-molecular-weight light emitting materials for organic EL devices which can be used in the light emitting layer include high molecular weight compounds such as polythiophene derivatives, polyphenylene derivatives, polyphenylene vinylene derivatives, and polyfluorene derivatives. Illustrative examples include poly (2-decyloxy-1,4-phenylene) (DO-PPP), poly[2,5-bis[2-(N, N,N-triethylammonium)ethoxy]-1,4-phenylene-ortho-1,4-phenylene]dibromide (PPP-NEt3+), poly[2-(2'-ethylhexyloxy)-5-methoxy-1,4-phenylene vinylene] (MEH-PPV), poly(5-methoxy-(2-propanoxysulfonide)-1,4-phenylene vinylene) (MPS-PPV), poly[2,5-bis(hexyloxy-1, 4-phenylene)-(1-cyanovinylene)] (CN-PPV), poly[2-(2'-ethylhexyloxy)-5-methoxy-1,4-phenylene-(1-cyanovinylene)] (MEH-CN-PPV), and poly (dioctylfluorene) (PDF).

Alternatively, as precursors to well-known high-molecular-weight light emitting materials for organic EL devices, use may be made of poly(p-phenylene) precursors (Pre-PPP), poly(p-phenylene vinylene) precursors (Pre-PPV), and poly(p-naphthalene vinylene) precursors (Pre-PNV).

It is also acceptable to use well-known low-molecular-weight light emitting materials for organic EL devices in combination with well-known high-molecular-weight materials such as polycarbonate (PC), polymethyl methacrylate (PMMA) and polycarbazole (PVCz).

If necessary, an additive for viscosity adjustment may be used. Particularly when the light emitting layer or hole injecting layer is formed by printing a uniform thin film of less than 100 nm, the light emissive polymer must be diluted to a very low concentration. Then minor amounts of a thickener and a gelling agent may be used as additives for increasing the viscosity and modulus of the solution for the purposes of preventing the transferred pattern from flowing and improving the transfer from an original to the base material, without adversely affecting the light emission performance of the organic EL device.

Among well-known high-molecular-weight charge transporting materials, useful hole transporting materials include carbazole derivatives, triazole derivatives, oxazole derivatives, oxadiazole derivatives, imidazole derivatives, polyarylalkane derivatives, pyrazoline derivatives, pyrazolone derivatives, phenylenediamine derivatives, arylamine derivatives, amino-substituted chalcone derivatives, styrylanthracene derivatives, fluorenone derivatives, hydrazone derivatives, stilbene derivatives, silazane derivatives, aromatic tertiary amine compounds, styrylamine compounds, aromatic dimethylidene compounds, porphyrin compounds, polysilane compounds, poly(N-vinylcarbazole) derivatives, conductive high-molecular-weight oligomers such as aniline copolymers, thiophene oligomers and polythiophene, and high molecular weight compounds such as polythiophene derivatives, polyphenylene derivatives, polyphenylene vinylene derivatives, and polyfluorene derivatives.

Useful electron transporting materials include high molecular weight compounds such as polythiophene derivatives, polyphenylene derivatives, polyphenylene vinylene derivatives, and polyfluorene derivatives.

A solvent is used in applying these high molecular weight compounds by a coating technique. Examples of the solvent include ethylene glycol, propylene glycol, triethylene glycol, ethylene glycol monomethyl ether, ethylene glycol monoethyl ether, triethylene glycol monomethyl ether, triethylene glycol monoethyl ether, glycerin, N,N-dimethylformamide, N-methyl-2-pyrrolidone, cyclohexanone, 1-propanol, octane, nonane, decane, xylene, diethylbenzene, trimethylbenzene, and nitrobenzene.

The organic material is preferably dissolved in the coating solvent in a concentration of 0.1 to 5% by weight. For application, any of coating techniques using any solution such as spin coating, spray coating, dip coating and flexogravure coating may be used. After coating, the device may be heated on a hot plate or the like for drying off the solvent. Heating is preferably effected at a temperature below the glass transition temperature (Tg) of the organic EL materials, usually about 50 to 80° C., and drying in vacuum or in an inert atmosphere is preferred.

The thickness of organic layer is preferably 0.5 to 1,000 nm, more preferably 10 to 500 nm per layer when the coating technique is resorted to; and about 1 to 500 nm when evaporation techniques such as vacuum evaporation are employed.

For the positive electrode (or hole injecting electrode), materials capable of effectively injecting holes into the hole injecting layer are preferred, with those materials having a work function of 4.5 to 5.5 eV being especially preferred. Useful are compositions based on tin-doped indium oxide (ITO), zinc-doped indium oxide (IZO), indium oxide ($In_2O_3$), tin oxide ($SnO_2$) or zinc oxide (ZnO). These oxides may deviate more or less from their stoichiometric compositions. An appropriate proportion of $SnO_2$ mixed with $In_2O_3$ is about 1 to 20%, more preferably about 5 to 12% by weight. For IZO, an appropriate proportion of ZnO mixed with $In_2O_3$ is about 12 to 32% by weight.

The hole injecting electrode may further contain silicon oxide ($SiO_2$) for adjusting the work function. The content of silicon oxide ($SiO_2$) is preferably about 0.5 to 10% as expressed in mol percent of $SiO_2$ based on ITO. The work function of ITO is increased by incorporating $SiO_2$.

The electrode on the light output side should preferably have a light transmittance of at least 50%, more preferably at least 80%, further preferably at least 90% in the light emission band, typically from 400 to 700 nm, and especially at each light emission. With a lower transmittance, the light emitted by the light emitting layer is attenuated through the electrode, failing to provide a luminance necessary as a light emitting device.

Preferably the electrode has a thickness of 50 to 500 nm, especially 50 to 300 nm. Although the upper limit of the electrode thickness is not critical, a too thick electrode would cause a drop of transmittance and separation. Too thin an electrode is insufficient for its effect and low in film strength during fabrication.

The negative electrode serving as an electron injecting electrode may be formed from the following materials. Examples include metal elements such as K, Li, Na, Mg, La, Ce, Ca, Sr, Ba, Sn, Zn, and Zr, and binary or ternary alloys made of two or three such metal elements for stability improvement. Exemplary alloys are Ag—Mg (Ag: 0.1 to 50 at %), Al—Li (Li: 0.01 to 14 at %), In—Mg (Mg: 50 to 80 at %), and Al—Ca (Ca: 0.01 to 20 at %).

Since monovalent ions of alkali metals (e.g., Li, Na, K), divalent ions of alkaline earth metals (e.g., Pt, Zn), trivalent ions of metals (e.g., Al, In) form relatively stable complexes with oxygen complexes (e.g., acetylacetone, acetic acid, oxalic acid, etc.), a thin layer of negative electrode can be formed by dissolving the complex in a solvent, and coating the solution.

The negative electrode thin film may have a sufficient thickness for electron injection, for example, a thickness of at least 0.1 nm, preferably at least 0.5 nm, more preferably at least 1 nm. Although the upper limit is not critical, the electrode thickness is typically about 1 to about 500 nm.

Further preferably, a shield plate may be provided on the device in order to prevent the organic layers and electrodes from deterioration. In order to prevent the ingress of moisture, the shield plate is attached to the base material through an adhesive resin layer for sealing. The sealing or fill gas is preferably an inert gas such as Ar, He, and $N_2$. The fill gas should preferably have a moisture content of up to 100 ppm, more preferably up to 10 ppm, especially up to 1 ppm. The lower limit of the moisture content is usually about 0.1 ppm though not critical.

The material of which the shield plate is made is preferably selected from the same materials as previously described for the base material. Using a spacer for height adjustment, the shield plate may be held at a desired height over the layer structure. The materials used as the spacer include resin beads, silica beads, glass beads, and glass fibers, with the glass beads being preferred.

When a shield plate having a recess is used, the spacer should preferably have a size in the above-described range, especially 2 to 8 μm.

Inside the shield plate, a desiccant, preferably $CaH_2$ may be contained.

Any adhesive which can maintain stable bond strength and gas tightness may be used although UV-curable epoxy resin adhesives of cation curing type are preferred.

Inorganic EL Device

The light emitting device structure may also be an inorganic EL structure. The inorganic EL device is generally configured as having an inorganic light emitting layer between a pair of electrodes. If necessary, an insulating layer and a dielectric layer may be disposed between the light emitting layer and the electrode.

Exemplary materials for the light emitting layer in the inorganic electroluminescence (EL) device include ZnS and Mn/CdSSe as the red light emitting material, ZnS:TbOF and ZnS:Tb as the green light emitting material, and SrS:Ce, (SrS:Ce/ZnS)n, GaCa$_2$S$_4$:Ce, and SrGa$_2$S$_4$:Ce as the blue light emitting material. SrS:Ce/ZnS:Mn or the like is known as the material capable of emitting white light.

Usually, the EL phosphor thin film includes a matrix material having a luminescence center added thereof. As the luminescence center, any of existing transition metals and rare earth elements may be added in a well-known amount. For example, any of rare earth elements such as Ce and Eu, and metals such as Cr, Fe, Co, Ni, Cu, Bi and Ag in metal or sulfide form may be added to the raw material. The amount of the luminescence center added varies with the raw material and the thin film formed therefrom, the composition of the raw material is adjusted so as to give an appropriate dose to the thin film.

In forming EL phosphor thin films from these materials, any of existing techniques such as evaporation, sputtering, CVD, sol-gel and printing/firing techniques may be used.

While the thickness of the light-emitting layer is not critical, it is appreciated that too large a thickness results in an increased drive voltage whereas too small a thickness leads to a drop of light emission efficiency. Specifically, the light-emitting layer preferably has a thickness of about 100 to 1,000 nm, and especially about 150 to 700 nm, although the thickness varies with the identity of the fluorescent material.

To obtain a sulfide phosphor thin film having a high luminance, a sulfide phosphor of the desired composition is preferably formed at a high temperature above 600° C. or annealed at a high temperature above 600° C., if necessary. Such a high temperature process is effective, particularly for producing a high luminance blue phosphor.

The substrate of the inorganic EL device is not critical although it should preferably withstand the heat treating temperature.

Any desired material may used as the substrate having a heat resistant temperature (capable of withstanding the above-described temperature) or melting point of at least 600° C., preferably at least 700° C., especially at least 800° C. as long as it is insulating, does not contaminate the overlying layers such as electrode layer and maintains the desired strength. Illustrative examples include ceramic substrates of alumina (Al$_2$O$_3$), forsterite (2MgO.SiO$_2$), steatite (MgO.SiO$_2$), mullite (3Al$_2$O$_3$.2SiO$_2$), beryllia (BeO), aluminum nitride (AlN), silicon nitride (SiN), and silicon carbide (SiC+BeO). All these have a heat resistant temperature of higher than 1,000° C. Of these, alumina substrates are especially preferable. Where heat transfer is necessary, beryllia, aluminum nitride, silicon carbide and the like are preferred.

Besides, quartz, heat resistant glass, and thermally oxidized silicon wafers may also be used.

The electrode layer, at least the electrode layer formed on the substrate side and exposed to high temperature during heat treatment along with the light emitting layer, is preferably based on silicon. The silicon electrode layer may be either polycrystalline silicon (p-Si) or amorphous silicon (α-Si), and optionally, single crystal silicon.

The electrode layer comprising silicon as the main component is doped with an impurity for imparting electrical conductivity. Since the dopant used as the impurity is only required to provide the predetermined electrical conductivity, those dopants customarily used for silicon semiconductors may be employed to this end. For instance, B, P, As, Sb, Al and the like may be used; however, preference is given to B, P, As, Sb and Al. The concentration of the dopant is preferably of the order of 0.001 to 5 at %.

The electrode layer must be endowed with conductivity by doping the silicon main component with the impurity before it can function as the electrode. For the efficient application of an electric field to the light-emitting layer, the electrode layer should preferably have a resistivity of 1 Ω·cm or lower, and especially 0.003 to 0.1 Ω·cm. The electrode layer has a thickness of preferably about 50 to 2,000 nm, and especially about 100 to 1,000 nm.

A gas phase deposition technique may be used to form the electrode layer. Where a single crystal substrate is used, it can be formed by a well-known method or preformed substrates may be purchased. The gas phase deposition techniques include physical gas phase deposition techniques such as sputtering and evaporation, and chemical gas phase deposition techniques such as CVD. Of these, the chemical gas phase deposition techniques such as CVD are preferred.

To form a Si layer by the CVD technique, a silicon source such as silane (SiH$_4$) or silicon chloride is furnished as a reactant gas. When it is necessary to incorporate another element, typically the above dopant, into silicon, the chloride, hydride or organic compound of the dopant is used as the source.

Examples of the silicon source include silicon fluoride such as SiF$_4$, silicon chloride such as SiCl$_4$, and silanes such as SiH$_4$, Si$_2$H$_6$, Si$_3$H$_8$, SiH$_3$Cl, SiH$_2$Cl$_2$, SiHCl$_3$, and SiCl$_4$.

The dopant is not critical as long as it can add B, P, As, Sb or Al element. Examples include arsines such as AsH$_3$, phosphins such as PH$_3$, phosphates such as POCl$_3$, diborans such as B$_2$H$_6$, Al(CH$_3$)$_3$, B(CH$_3$)$_3$, etc. These reactive gases may be used alone or in admixture of two or more. When a mixture of two or more reactive gases is used, the mixing ratio is not critical.

Also, H$_2$, He, Ar, etc. may be used as the carrier gas. The reaction temperature may be about 500 to 1,000° C.

It is noted that the chemical gas phase growth technique may be plasma CVD and atmospheric pressure CVD as well as conventional vacuum CVD. The mixing ratio of carrier gas to source, flow rate and other parameters may be adjusted optimum depending on the resistivity of the thin film silicon layer or the like.

Apart from the above CVD technique, the silicon layer may also be formed by the physical gas phase deposition technique such as EB evaporation or RF sputtering.

Apart from the above electrode, any commonly used metal electrode of platinum, tantalum, nickel, chromium, titanium or the like may be employed.

The other electrode layer is preferably a transparent substrate having light transparency in the predetermined emission wavelength region in order to extract light emission therethrough. In this case, a transparent electrode of ZnO, ITO or the like is especially preferred. ITO generally contains In$_2$O$_3$ and SnO in stoichiometry although the O content may deviate more or less therefrom. An appropriate proportion of SnO$_2$ mixed with In$_2$O$_3$ is about 1 to 20%, more preferably about 5 to 12% by weight. For IZO, an appropriate proportion of ZnO mixed with In$_2$O$_3$ is generally about 12 to 32% by weight.

The thin film EL device has an insulating layer between the electrode layer and the fluorescent thin film (or light emitting layer). The insulating layer may be formed of an oxide of preferably the aforementioned electrode constituting material. The oxide of the electrode constituting material may be formed by introducing an oxygen-containing gas such as O$_2$ gas during formation of the electrode. In this way, the oxide can be formed continuously to the electrode simply by introducing the oxygen-containing gas during formation of the electrode material, which simplifies the manufacturing process.

Also a thermal oxidation technique used in the semiconductor manufacturing process may be employed. The thermal oxidation technique may be any of dry $O_2$ oxidation, wet $O_2$ oxidation, and steam oxidation. In the case of dry $O_2$ oxidation, Pb, HCl, $Cl_2$, $C_2HCl_3$ or the like may be admixed in oxygen, if necessary.

The insulating layer formed using the electrode constituting material preferably has a thickness of about 20 to 500 nm, and especially about 50 to 300 nm.

The insulating layer may be different from the oxide of the electrode constituting material. In particular, the insulating layer on the side of the other electrode not to be heat treated (disposed above the light emitting layer) is formed separately from the electrode forming step. In this case, the insulating layer has a resistivity of at least $10^8$ Ω·cm, and especially about $10^{10}$ to $10^{18}$ Ω·cm. Also, a material having a relatively high permittivity is preferred. Its permittivity $\epsilon$ is preferably about 3 to 1000.

Examples of the material of the insulating layer which is formed separately from the electrode include silicon oxide ($SiO_2$), silicon nitride (SiN), tantalum oxide ($Ta_2O_5$), strontium titanate ($SrTiO_3$), yttrium oxide ($Y_2O_3$), barium titanate ($BaTiO_3$), lead titanate ($PbTiO_3$), zirconia ($Zr_2O_3$), silicon oxynitride (SiON), alumina ($Al_2O_3$), and lead niobate ($PbNbO_3$). A transparent ceramic layer containing $SiO_2$, BaO, $B_2O_3$, $Al_2O_3$, CaO or the like may also be used as the insulating layer in order to provide light transmittance. The method of forming the insulating layer from these materials is the same as used for the electrode. The insulating layer preferably has a thickness of about 50 to 1,000 nm, and especially about 100 to 500 nm.

After the insulating layer of the electrode constituting material is formed, an insulating layer of another material may be formed to give a double layer if necessary.

EXAMPLE

Examples of the invention are given below together with comparative examples by way of illustration.

Example 1-1

A polyether sulfone resin sheet of 200 μm thick, which is colorless, transparent as demonstrated by an overall light transmittance of at least 90% and heat resistant as demonstrated by a Tg of 230° C. (FS-5300 by Sumitomo Bakelite Co., Ltd.) was used as a base material 1 as shown in FIG. 1. This substrate 1 on both surfaces was coated with a 20 wt % dibutyl ether (DBE) solution of partially methyl-modified polysilazane (10 at % of hydrogen in the structure being substituted) (L710 by Tonen Corp., Pd catalyst-containing product) by dip coating, and dried by heating. While supplying humid air (humidified by bubbling air into pure water) into a clean oven held at 200° C., the coated substrate was subjected to steam oxidation by heating in the oven for 2 hours. The coated substrate was then heat treated in an air atmosphere at 230° C. for one hour. There was obtained a flexible transparent substrate having a dense silica layer of about 1.2 μm thick containing a minute amount of methyl groups on either surface of the base material.

Next, a pattern of filter layer 2 was formed on the substrate using color filters available from Fuji Hunt Co., Ltd. as the blue transmissive layer, green transmissive layer and red transmissive layer, specifically a green filter capable of cutting light with a wavelength of 560 nm or more and light with a wavelength of 480 nm or less, a blue filter capable of cutting light with a wavelength of 490 nm or more, and a red filter capable of cutting light with a wavelength of 580 nm or less.

Next, a coating solution in the form of a xylene solution of perhydropolysilazane (Mn=1,000) as above (concentration 20 wt %, L710 by Tonen Corp., several ten angstrom Pd catalyst-containing product) was applied onto the substrate having the color filter pattern formed thereon, using a thin layer coater selected from a spin coater, die coater, flexo coater and gravure coater, typically a spin coater, to such a thickness as to finally give a silica film having a thickness of about 0.5 μm. The coating was dried in hot air. As in the case of the above substrate, while supplying water-bubbled air into a clean oven, the coating was subjected to heating and steam oxidation in the oven at 200° C. for 30 minutes to 1 hour. The substrate was then heated on a hot plate at 230° C. for one hour for oxidation and dehydration. Owing to the Pd catalyst included, the heating and steam oxidation caused the perhydropolysilazane to be converted into a silica film. The heating at 230° C. was continued to completely remove the water, obtaining a silica film of 1.2 μm thick which was a barrier layer 3 having a dense silica film.

Further, ashing was carried out for 10 minutes using an oxygen plasma (power 2 kW, substrate temperature 200° C.). This treatment cleaned the surface of the barrier layer serving as an overcoat on the color filter too, thereby forming a more flat, complete a-$SiO_2$ passivation layer 3.

Next, an ITO transparent electrode (hole injecting electrode) having a thickness of 85 nm was deposited and patterned so as to define a pixel matrix of 64 dots×7 lines (100×100 μm per pixel). The substrate having the patterned hole injecting electrode formed thereon was subjected to ultrasonic washing with neutral detergent, acetone, and ethanol, pulled up from boiling ethanol, and dried. The transparent electrode was further cleaned with UV/ozone.

Thereafter, the substrate was moved to a deposition chamber where it was secured by a holder in a vacuum evaporation unit, which was evacuated to a vacuum of $1\times10^{-4}$ Pa or lower. Poly(thiophene-2,5-diyl) was evaporated to a thickness of 10 nm, forming a hole injecting layer. TPD doped with 1% by weight of rubrene was co-evaporated to a thickness of 5 nm, forming a hole transporting and yellow light emitting layer. The preferred concentration of rubrene is about 0.1 to 10% by weight because efficient light emission occurs within this concentration range. The concentration may be determined in accordance with a color balance of light emission and depend on the light intensity and wavelength spectrum of a blue light emitting layer to be subsequently deposited. Then, 4'-bis[(1,2,2-triphenyl)ethenyl]biphenyl was deposited to form a blue light emitting layer of 50 nm thick, and Alq3 was deposited to form an electron transporting layer of 10 nm thick.

Next, AlLi (Li 7 at %) was evaporated to a thickness of 1 nm, and an Al electrode layer was deposited to a thickness of 200 nm, forming an organic EL structure 4. Prior to sealing as an organic EL display, a solidified mixture of a desiccant ($CaH_2$) and silicone rubber was contained (not shown). Finally, the structure was sealed with a film 5 in the form of a PCTFE film of 100 μm thick (ETFE used in Example 2, but free of UV absorber) coated with EVA, obtaining an organic EL display. The PCTFE film used herein is superior in water absorption and water vapor transmission rate to ETFE.

As a comparative sample, a polyether sulfone resin (PES) sheet of 200 μm thick, which is colorless, transparent as demonstrated by an overall light transmittance of at least 90% and heat resistant as demonstrated by a Tg of 230° C.

(FS-5300 by Sumitomo Bakelite Co., Ltd.) was used as a substrate, and a color filter was provided directly thereon. An organic resin overcoat composition comprising an acrylic resin, reactive acrylic monomer, photo-sensitizer, and polymerization catalyst was coated thereon to a thickness of 5 μm, cured with UV in a dose of 400 mJ/cm$^2$, and further thermoset by heating at 150° C., forming an overcoat layer serving as a leveling layer. There was prepared a sample without a barrier layer (Sample #A).

With a DC voltage applied thereacross, each of the organic EL color displays thus fabricated was continuously driven at a constant current density of 50 mA/cm$^2$. The inventive sample had a luminance half-life period of at least 400 hours whereas comparative Sample #A had a luminance half-life period of no more than 50 hours. Although very few minute dark spots were ascertained, the growth of dark spots was not found in the inventive sample after a lapse of 400 hours or more. By contrast, many dark spots which had grown large to a diameter of at least about 100 μm within 50 hours were found in comparative Sample #A.

It is evident from the results that the provision of a barrier layer according to the invention ensures a lifetime at least equal to that of a prior art display having both an overcoat layer and a barrier layer. It is noted that substantially equivalent results were obtained when color filter layers were used in combination with a fluorescence conversion layer.

It is noted that the organic EL displays fabricated herein including the comparative sample were lightweight as compared with prior art displays using glass substrates or sealed glass substrates and resistant to shocks enough to avoid any damage that would lead to failure of the panel. It was thus confirmed that the inventive display is suited for use in portable equipment.

Example 1-2

A 7059 glass substrate (Corning Glass Works) as a base material, after cleaning, was immersed in a 0.3% aqueous solution of KBM603 (Shin-Etsu Silicone Co., Ltd.), washed with water, treated with a silane coupling agent, and baked at 220° C. for one hour.

Then, a red Transer film (Fuji Photo Film Co., Ltd.) was laminated to the substrate at 130° C., a pressure of 2 MPa and a rate of 1.4 m/min. Then the base film of the Transer film was stripped. After masking with a red mask, the film was entirely exposed to a ultrahigh pressure mercury lamp so as to give an integral dose of 50 to 100 mJ/cm$^2$.

Next, red pixels were formed by a process using a selected developer and developing agent. Using the ultrahigh pressure mercury lamp, post-exposure was carried out from both the back surface of the glass substrate and the pixel-forming surface and to an exposure dose of 500 mJ/cm$^2$. The glass substrate was further baked at 220° C. for 120 minutes, obtaining a color filter for red pixels.

Further, using a green Transer film and blue Transer film, the same operation as above was carried out, whereby a high precision full color filter of red, green and blue was fabricated. If necessary, a black matrix could be formed by the same operation as the above filter, specifically by laminating a black Transer film on the R, G, B color filter, and carrying out exposure under a ultrahigh pressure mercury lamp from the glass substrate side on the back surface of the R, G, B color filter so as to give an integral dose of 50 to 100 mJ/cm$^2$, where the RGB pixels served as a mask to accomplish back surface exposure.

Next, onto the filter on the substrate, a 30 wt % xylene solution of a partially methyl-modified polysilazane (hydrogen substitution in the structure 10 at %) (Pd catalyst-containing product) was applied as in Example 1 using a spin coater. This was followed by steam oxidation and baking, yielding a fully flat, dense silica film of 0.4 μm thick having a high light transmittance and heat resistance and containing a minute amount of methyl groups.

Onto the silica film, a 20 wt % xylene solution of a methyl group-free polysilazane [—(SiH$_2$—NH)$_m$—] was applied using a spin coater. This was followed by steam oxidation and baking under the same conditions as above, yielding a fully flat, dense silica film of 0.4 μm thick having a high light transmittance and heat resistance.

Next, as in Example 1-1, after oxygen plasma ashing, a hole injecting layer, a light emitting layer and other constituent layers were formed by the dry process, fabricating an organic EL device.

The silica film obtained herein from the methyl group-free polysilazane is a fully dense amorphous inorganic silica film which is best suited as a barrier film against water vapor and oxygen gas, but can crack when its thickness reaches 0.6 μm. By contrast, the film obtained from the partially methyl-modified polysilazane does not crack even when its thickness exceeds 1.0 μm and is fully effective for leveling out the surface of the underlying full color filter and fabricating an improved EL device. That is, the film is effective for maintaining flatness (Rmax no more than 20 nm by roughness measurement by AFM). This maintains flatness and uniformity while forming thereon a very thin organic EL light emitting layer, ITO transparent electrode thin film and the like by the vacuum process, which is effective for preventing an organic EL display from "dark spots" and "color variations on screen" caused by local asperities.

The inorganic amorphous silica film is superior as a gas passivation film, and even in a high temperature holding test for evaluating the accelerated life deterioration of an organic EL display, restrains the occurrence of "dark spots" and the growth of minute dark spots and inhibits the occurrence of "color variations on screen" and the growth during the deterioration test.

Example 1-3

Figure 2:
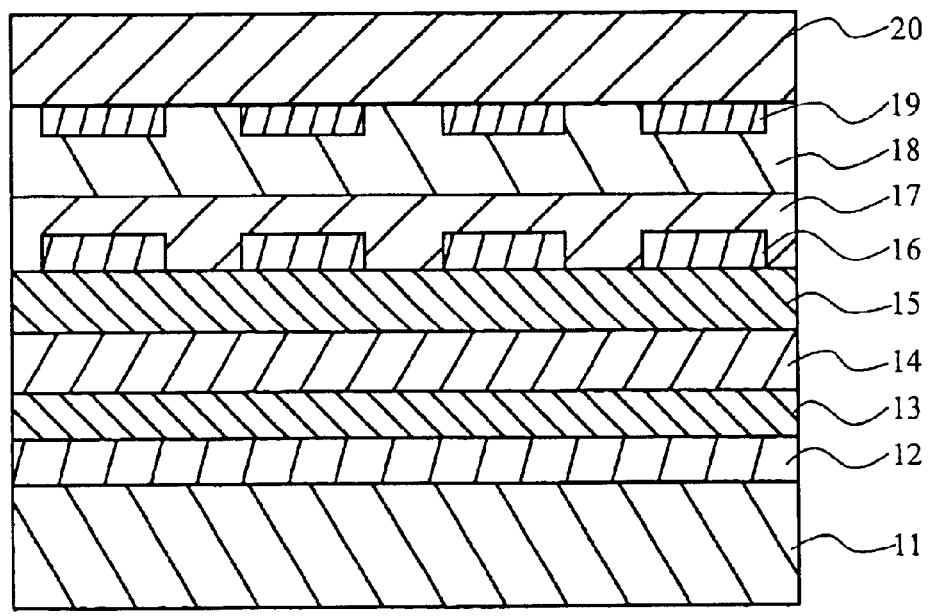
FIG. 2 is a schematic cross-sectional view showing the basic construction of an inorganic EL device embodying the light emitting device of the invention.

An alumina substrate was used as a substrate 11 as shown in FIG. 2. On the substrate 11, an Al electrode 12 was formed to a thickness of 200 nm by an RF sputtering technique. Next, by an RF sputtering technique using a target containing SiO$_2$, BaO, B$_2$O$_3$, Al$_2$O$_3$ and CaO in a weight ratio of 45:30:12:12:1 under conditions: input power 1.5 kW, O$_2$ 2% and 0.4 Pa, the material was deposited to a thickness of 100 nm. This was annealed at 220° C. for 4 hours for crystallization, obtaining a lower insulating layer 13 in the form of a glass ceramic film.

On the lower insulating layer, a ZnS:Mn phosphor thin film (light emitting layer) 14 of 600 nm thick was formed at a substrate temperature of 200° C. by an EB evaporation technique and annealed in vacuum at 600° C. for 10 minutes. Then, a SrS:Ce phosphor thin film 14 of 600 nm thick was formed at a substrate temperature of 550° C. by an RF magnetron sputtering technique using Ar gas and a target based on a matrix material of ZnS and SrS in a molar ratio of 1:3 having added thereto 0.2 mol % based on SrS of Ce$_2$S$_3$, with which 33.3% based on the matrix material of ZnS was admixed.

Next, an upper insulating layer 15 in the form of a glass ceramic film was similarly formed on the SrS:Ce phosphor thin film 14 to a thickness of 100 nm.

Further, by an RF magnetron sputtering technique using an ITO oxide target, an ITO transparent electrode 16 of 200 nm thick was formed at a substrate temperature of 250° C. in a predetermined pattern, obtaining an EL structure.

A 20 wt % solution of polysilazane in xylene which had been fully dehydrated through a molecular sieve was applied by a precision die coater (CAP Coater by Hirano Technoseed K.K.), dried on a hot plate at 100° C. in a $N_2$ atmosphere, pre-baked, and fired at 900° C. for 30 minutes in a vacuum heating furnace maintained at a vacuum of 0.001 Pa, forming a $SiN_x$ insulating layer 17.

Since the $SiN_x$ insulating layer was a thin film having a thickness of 200 nm, a 30 wt % xylene solution of a partially methyl-modified polysilazane (hydrogen substitution in the structure 10 at %) (Pd catalyst-containing product) was then applied as in Example 1, using a die coater. This was pre-baked and baked at 350° C. for one hour (only heating, without humidifying), forming a silica layer 17 of 2.5 μm thick containing a minute amount of methyl groups.

Next, as in Example 1-2, R, G and B Transer films (by Fuji Photo Film Co., Ltd.) were attached onto the glass seal plate (7059 substrate by Corning Glass Works), exposed and baked, obtaining a color filter 19.

Further, a film 18 of 100 μm thick, into which a low melting, thermoplastic fluoro-resin Dainion THV-400 (by 3M Sumotomo Co., Ltd.) was extrusion molded through a T die, was interposed between a color filter 19 of a sealing plate and the methyl group-containing silica layer 17 of the EL structure and processed at 150° C. for one hour by means of a vacuum laminator, obtaining a full color inorganic EL device as shown in FIG. 2.

After electrodes were extended from the Al electrode and ITO transparent electrode using probe electrodes, a sinusoidal AC electric field of 1 kHz was applied across the structure in vacuum, whereby desired light emission took place in a reproducible manner.

Example 2-1

A pattern of filter layer was formed on a 7059 glass substrate (Corning Glass Works) using color filters available from Fuji Hunt Co., Ltd. as the blue transmissive layer, green transmissive layer and red transmissive layer, specifically a green filter capable of cutting light with a wavelength of 560 nm or more and light with a wavelength of 480 nm or less, a blue filter capable of cutting light with a wavelength of 490 nm or more, and a red filter capable of cutting light with a wavelength of 580 nm or less.

Next, a coating solution in the form of a xylene solution of perhydropolysilazane (Mn=1,000) (concentration 20 wt %, L110 by Tonen Corp., several ten angstrom Pd catalyst-containing product) was applied onto the substrate having the color filter pattern formed thereon, using a thin layer coater selected from a spin coater, die coater, flexo coater and gravure coater, to a wet film thickness of about 1.5 μm. The coating was dried in hot air and annealed at 180° C. for 30 minutes to 1 hour. Then the substrate was subjected to continuous heating and steam oxidation in an atmosphere of 90° C. and RH 80% for 3 hours. Owing to the Pd catalyst included, the heating and steam oxidation caused the perhydropolysilazane to be converted into a silica film. This was directly followed by heating at 110° C. to completely remove the water, obtaining a silica film of 1.0 μm thick which was a barrier layer having a silica film.

Further, ashing was carried out for 10 minutes using an oxygen plasma (power 2 kW, substrate temperature 200° C.). This treatment further cleaned the surface of the barrier layer serving as an overcoat on the color filter too, thereby forming a more flat, complete a-$SiO_2$ passivation layer.

Next, an ITO transparent electrode (hole injecting electrode) having a thickness of 85 nm was deposited and patterned so as to define a pixel matrix of 64 dots×7 lines (100×100 μm per pixel). The substrate having the patterned hole injecting electrode formed thereon was subjected to ultrasonic washing with neutral detergent, acetone, and ethanol, pulled up from boiling ethanol, and dried. The transparent electrode was further cleaned with UV/ozone.

Thereafter, the substrate was moved to a deposition chamber where it was secured by a holder in a vacuum evaporation unit, which was evacuated to a vacuum of $1×10^{-4}$ Pa or lower. Poly(thiophene-2,5-diyl) was evaporated to a thickness of 10 nm, forming a hole injecting layer. TPD doped with 1% by weight of rubrene was co-evaporated to a thickness of 5 nm, forming a hole transporting and yellow light emitting layer. The preferred concentration of rubrene is about 0.1 to 10% by weight because efficient light emission occurs within this concentration range. The concentration may be determined in accordance with a color balance of light emission and depend on the light intensity and wavelength spectrum of a blue light emitting layer to be subsequently deposited. Then, 4'-bis[(1,2,2-triphenyl)ethenyl]biphenyl was deposited to form a blue light emitting layer of 50 nm thick, and Alq3 was deposited to form an electron transporting layer of 10 nm thick.

Next, AlLi (Li 7 at %) was evaporated to a thickness of 1 nm, and an Al electrode layer was deposited to a thickness of 200 nm. The structure was finally glass sealed, obtaining an organic EL display.

As a comparative sample, an acrylic resin was coated on the color filter to a thickness of 5 μm, and thermoset by heating at 150° C., forming an overcoat layer. There was prepared a sample without a barrier layer (Sample #A).

With a DC voltage applied thereacross, each of the organic EL color displays thus fabricated was continuously driven at a constant current density of 50 mA/cm². The inventive sample had a luminance half-life period of at least 500 hours whereas comparative Sample #A had a luminance half-life period of no more than 50 hours. It is evident from the results that the provision of a barrier layer according to the invention ensures a lifetime at least equal to that of a prior art display having both an overcoat layer and a barrier layer. It is noted that substantially equivalent results were obtained when color filter layers were used in combination with a fluorescence conversion filter layer.

Example 2-2

As in Example 2-1, a pattern of color filter layer was formed on a glass substrate.

Next, a coating solution in the form of a xylene solution of an organic polysilazane obtained by substituting $CH_3$ for the hydrogen of $NH_2$ group on perhydropolysilazane (#L110) used in Example 2-1 (concentration 20 wt %, Tonen Corp.) was applied onto the substrate having the color filter pattern formed thereon, to a wet film thickness of 1.5 μm using a spin coater. The coating was dried in hot air and annealed at 180° C. for 30 minutes.

Next, as in Example 2-1, peroxysilazane (D820, by Tonen Corp., molecular weight Mn=700, 5 wt % trimethylamine added as catalyst) was applied to a wet film thickness of 1.5 μm using a spin coater. The coating was dried in hot air and annealed at 180° C. for 30 minutes.

Then the substrate was subjected to continuous heating and steam oxidation in an atmosphere of 90° C. and RH 80% for 3 hours, thereby converting the silazane into a silica film.

This was directly followed by heating at 110° C. to completely remove the water, obtaining a silica film of 0.8 μm thick which was a second barrier layer having a silica film.

Further, ashing was carried out for 10 minutes using an oxygen plasma (power 2 kW, substrate temperature 200° C.). This treatment further cleaned the surface of the barrier layer serving as an overcoat on the color filter too, thereby forming a more flat, complete a-SiO$_2$ passivation layer.

The resulting passivation film of two layer structure was further improved in "affinity" and "adherence" to the patterned color filter surface over the passivation film of Example 2-1 because the methyl group-containing organic/inorganic (SiO$_2$) hybrid barrier layer resulting from the organic polysilazane intervened as the first layer.

However, when an accelerated humid, chemical resistant test was carried out on a passivation film consisting solely of the first layer, the barrier layer was attacked by a remover (containing organic strong alkali in NMP solvent) for removing residues of the positive resist used in forming the color filter. It was confirmed that the second layer of dense SiO$_2$ achieved a very effective function.

When a film of a transparent cured product of a mixture of perhydropolysilazane and a UV crosslinkable acrylate derivative containing a photo-polymerization initiator exemplified as the hybrid organic-inorganic resin layer (1), and films similarly exemplified as (2) and (3) were used instead of the first barrier layer of this Example, an accelerated humid, chemical resistant test showed the tendency that the barrier layer was attacked by the remover upon heating. It is thus seen that on application to EL devices, the second dense SiO$_2$ layer in this Example is indispensable for blocking moisture and O$_2$ gas and outgassing from the color filter to the organic layers and electrode.

Next, as in Example 2-1, the ITO transparent electrode was patterned, and a hole injecting layer, a hole transporting layer, an electron injecting and transporting and light emitting layer, and an AlLi/Al electrode layer were formed. The structure was finally glass sealed, obtaining an organic EL display (Sample 2).

With a DC voltage applied thereacross, the organic EL color display thus fabricated was continuously driven at a constant current density of 50 mA/cm$^2$, finding a luminance half-life period of at least 500 hours. It is evident from the results that the provision of a barrier layer according to the invention ensures a lifetime at least equal to that of a prior art display having both an overcoat layer and a barrier layer.

Example 2-3

A 7059 glass substrate (Corning Glass Works) which had been baked at 200° C. for 2 hours was placed in a radio frequency ion plating system equipped with a mask alignment unit. An RF power of 200 W was fed to the coil of the ion plating system to generate an argon plasma for cleaning the substrate surface by ion bombardment, following which the substrate temperature was lowered to 50° C.

Next, a graphite cell was filled with an organic coloring pigment, which was sublimated in vacuum of about 1.33× 10$^{-6}$ Pa (10$^{-4}$ Torr), depositing a color filter film. Presumably because passage of the sublimated organic pigment through the plasma results in the organic pigment on its surface being activated by collision with the plasma gas, a film which is satisfactory with respect to substrate adherence and flatness, as compared with the film evaporated by simple resistive heating, is obtained due to the interaction between the substrate and the organic pigment.

The red (R), blue (B) and green (G) organic pigments used were evaporable organic pigments which satisfy "prevention of roughening of flat surface by crystal growth after film deposition on glass substrate," "toning performance as a color filter" and "resistance to substrate heating (at about 250° C. or higher)" as shown below. The heat resistance is mainly resistance to thermal annealing which is carried out on an ITO transparent electrode film formed on the filter layer for improving the crystallinity and reduce the resistivity thereof.

R: diketopyrrolopyrrole red

G: tetramethoxyvanadylphthalocyanine

B: monochloro-Cu-phthalocyanine

The R, G, B filter layers were patterned through Ni metal masks.

The thus obtained color filter was a thin film of 0.3 to 0.7 μm thick which was flat with a minimal thickness variation. There was obtained a color filter exhibiting a sufficient chromaticity and having a high light transmittance.

Next, as in Example 2-1, a coating solution in the form of the xylene solution of perhydropolysilazane (L110 by Tonen Corp.) was diluted with dibutyl ether, overcoated using a thin film applicator (CAP Coater by Hirano Techseed K.K.), humidified and heated under the same conditions as in Example 2-1, forming an a-SiO$_2$ layer of 1.5 μm thick on the filter layer.

Further, ashing was carried out using an oxygen plasma as in Example 2-1, thereby converting the surface of the SiO$_2$ layer into a more complete a-SiO$_2$ passivation layer. The surface was flat as demonstrated by a thickness variation within Ra 30 nm. There was obtained a color filter exhibiting a sufficient chromaticity and having a high light transmittance.

Next, as in Example 2-1, the ITO transparent electrode was patterned, and a hole injecting layer, a hole transporting and light emitting layer, a light emitting layer, an electron injecting and transporting layer and an AlLi/Al electrode layer were formed. The structure was finally glass sealed, obtaining an organic EL display (Sample 3).

With a DC voltage applied thereacross, the organic EL color display thus fabricated was continuously driven at a constant current density of 50 mA/cm$^2$, finding a luminance half-life period of at least 500 hours. It is evident from the results that the provision of a barrier layer according to the invention ensures a lifetime at least equal to that of a prior art display having both an overcoat layer and a barrier layer. It is noted that substantially equivalent results were obtained when color filter layers were used in combination with a fluorescence conversion filter layer.

Example 2-4

A polyarylate resin cast film which is colorless, transparent as demonstrated by an overall light transmittance of at least 90% and heat resistant as demonstrated by a Tg of 288° C. (MF-2000 by Unitika, Ltd.) was used instead of the glass substrate used in Example 2-1.

The film was baked at 200° C. for one hour to remove outgassing components such as low-molecular-weight components and water from within the film, after which color filter layers were formed in a pattern as in Example 1.

As a first layer of an overcoat layer on the color filter layers, polysilsesquioxane polymer chemically modified with zirconia having the following structure (ZRS™ by Shokubai Kasei Kogyo K.K.) was coated to a thickness of 2.5 μm and thermoset at 240° C. for 30 minutes.

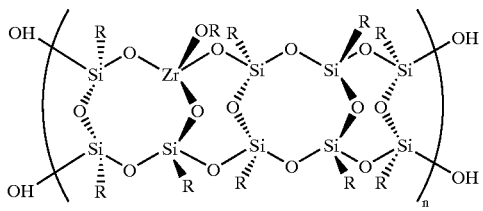

Next, as in Example 2-1, a coating solution in the form of the xylene solution of perhydropolysilazane (L110 by Tonen Corp.) was diluted with dibutyl ether, coated as a second layer on the first layer to a wet film thickness of 1.5 μm using a spin coater, dried in hot air and annealed at 180° C. for 30 minutes. The substrate was then subjected to continuous heating and steam oxidation in an atmosphere of 90° C. and RH 80% for 3 hours.

Next, as in Example 2-1, the ITO transparent electrode was patterned, and a hole injecting layer, a hole transporting and light emitting layer, a light emitting layer, an electron injecting and transporting layer and an AlLi/Al electrode layer were formed. The structure was finally glass sealed, obtaining an organic EL display (Sample 4).

With a DC voltage applied thereacross, the organic EL color display thus fabricated was continuously driven at a constant current density of 50 mA/cm$^2$, finding a luminance half-life period of at least 500 hours. It is evident from the results that the provision of a barrier layer according to the invention ensures a lifetime at least equal to that of a prior art display having both an overcoat layer and a barrier layer.

This sample was lightweight because of the plastic substrate and eliminated the risk of brittle fracture as in glass. There was obtained a film-like organic EL display having appropriate flexibility.

Example 3-1

Figure 3:
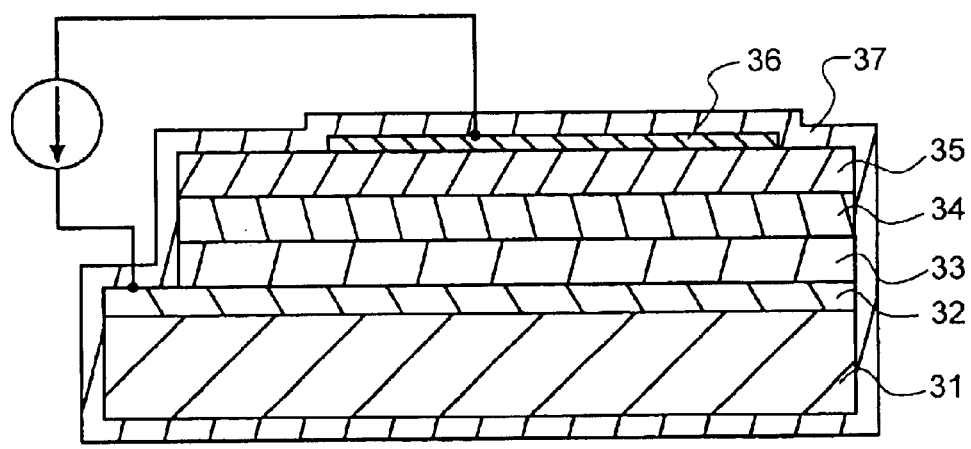
FIG. 3 is a schematic cross-sectional view showing the basic construction of an organic EL device fabricated in Example 3-1 and embodying the light emitting device of the invention.

An optical electroconductive film Elclear HT-60 (optically isotropic polycarbonate film by Teijin Ltd.) in which a polycarbonate resin base was sandwiched between gas barrier layers and provided on one side with an ITO transparent electrode thin film was used as a substrate 31 as shown in FIG. 3 and scrubbed with a neutral detergent. The ITO film was fully dried by heating and used as a hole injecting electrode layer 32. The ITO film had a surface resistivity of 60 Ω/□.

After the surface of the substrate having formed thereon the ITO electrode layer 32 and the like was cleaned with Uv/O$_3$, a resist was coated and photolithographically patterned into stripes at a pitch of 1 mm.

Next, a hole transporting layer 33 was formed. The hole transporting layer was formed by dissolving 1.5% by weight of poly(3,4-ethylene dioxythiophene/polystyrene sulfonate (PEDOT/PSS) in toluene solvent and spin coating the solution to a thickness of 40 nm.

Next, as a light emitting layer 34, a coating solution in the form of a precursor methanol solution (a polymer concentration of 1 g of polyphenylene vinylene (PPV) in 10 to 25 g of methanol, by Cambridge Display Technology LDT) was uniformly spin coated on the substrate having the PEDOT formed thereon.

Further, the substrate was moved to a vacuum evaporation chamber where LiF was deposited to a thickness of 6 nm and metallic Ca was subsequently deposited to a thickness of 6 nm as an electron injecting and transporting layer.

Thereafter, Al was evaporated to a thickness of 200 nm, forming a negative electrode 36.

To the module in which leads were soldered to the Al electrode and ITO electrode, a solution of polysilazane in xylene containing 30% of Pd catalyzed NV (L110 by Tonen Corp.) was applied to a thickness of 1.2 μm by three-dimensional spray coating technique using a precision spray coater by EV Group US Inc. or Nordson, immediately dried and baked. The baking converted the precursor polymer into a PPV film having EL light emissive characteristics (thickness 200 to 300 nm).

By effecting polysilazane dip coating in this way, a flexible organic EL device sealed with $SiO_xN_y$ (O/(O+N) atomic ratio 70%) of 1 μm thick was obtained.

An electric field was applied across the organic EL device sample in air whereupon the sample exhibited diode characteristics. When biased with the ITO side positive and the LiF/Ca/Al electrode side negative, the current flow increased with an increasing voltage and definite light emission was observed in an ordinary room. Neither current leakage nor light emission from electrode lines other than the selected ones was found. Even after an accelerated deterioration test of 100 hours in a 80° C. atmosphere, the device showed no deterioration of luminance and the occurrence of dark spots was not confirmed.

Example 3-2

Figure 4:
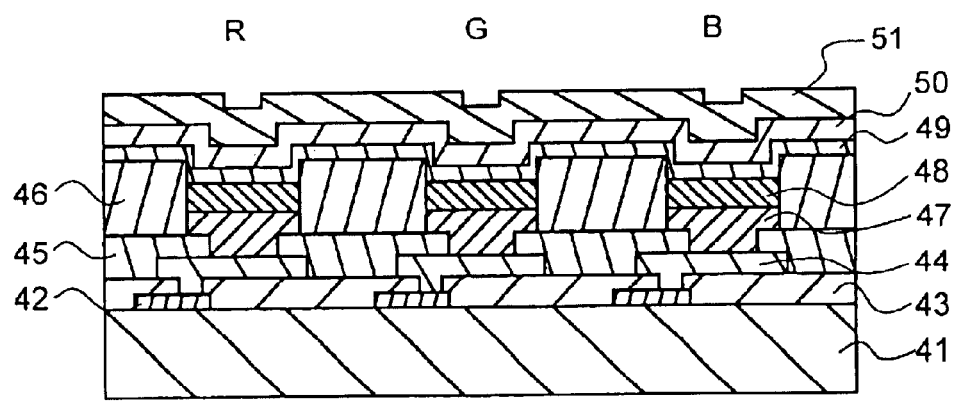
FIG. 4 is a schematic cross-sectional view showing the basic construction of an organic EL device fabricated in Example 3-2 and embodying the light emitting device of the invention.

As shown in FIG. 4, an amorphous silicon layer was deposited on a substrate 41 of 1737 heat resistant, alkali-free glass (Corning Glass Works) by a CVD technique. Solid phase growth was induced in the amorphous silicon layer by heating and laser annealing to thereby form an active layer (polysilicon layer), on which a $SiO_2$ layer serving as a gate oxide film was deposited, for example, by a plasma CVD technique. On the $SiO_2$ layer, a Mo—$Si_2$ layer serving as a gate electrode was formed by a sputtering technique. The Mo—$Si_2$ layer and the previously formed $SiO_2$ layer were patterned, for example, by dry etching, obtaining the gate electrode and gate oxide film.

Next, using the gate electrode as a mask, an N type impurity P was doped in the portions of the silicon active layer to become source and drain regions by an ion doping technique.

Next, the structure was heated in a nitrogen atmosphere at about 550° C. for 10 hours for activating the dopant. It was heat treated in a hydrogen atmosphere at about 400° C. for 30 minutes for hydrogenation for thereby reducing the defect level density of semiconductor.

Then a first $SiO_2$ layer serving as an insulating layer was formed all over the substrate to a thickness of about 8,000 Å. Contact holes were formed in the first $SiO_2$ film 43 serving as an insulating layer by etching. Thereafter, Al was evaporated as drain and source wiring electrodes, forming a TFT array 42.

Next, ITO 44 serving as a hole injecting electrode was deposited in regions where organic EL devices were to be formed, and connected to the wiring electrodes. The ITO 44 was patterned, after which a second $SiO_2$ layer 45 was formed to a thickness of 100 nm and patterned so as to cover areas other than the light emitting regions.

A device isolating structure was formed on the second $SiO_2$ layer 45 by applying polyimide to a thickness of about 1 to 2 μm and patterning into isolation partitions 46.

Next, a hole transporting layer 47 was formed. The hole transporting layer 47 was formed by dissolving 1.5 wt % of PEDOT/PSS in toluene solvent and spin coating the solution to a thickness of 40 nm.

The substrate coated with PEDOT/PSS was dried in vacuum at 80° C. for one hour, after which three polyfluorene light emitting layers 48 corresponding to R, G and B emission colors were coated from their xylene solutions. The film was 700 nm thick. It was further vacuum dried at 80° C. for 10 minutes.

Next, the substrate was moved to a vacuum evaporation chamber where LiF was deposited to a thickness of 5 nm as an inorganic electron injecting layer 49. Subsequently, Al was evaporated to a thickness of 200 nm, forming a negative electrode 50. A protective film 51 was formed on the electron injecting electrode as in Example 3-1. The structure was finally glass sealed, obtaining an organic EL device.

An electric field was applied across the organic EL device sample in air whereupon each pixel exhibited diode characteristics. When biased with the ITO side positive and the LiF/Al electrode side negative, the current flow increased with an increasing voltage and definite light emission from each pixel was observed in an ordinary room. Neither current leakage nor light emission from electrode lines other than the selected ones was found.

Benefits of the Invention

There has been described a light emitting device comprising a base material or protective member which has improved light transmittance, heat resistance, passivation (gas barrier, oligomer release prevention and minimized outgassing), anti-water or moisture-absorption, stability against chemical degradation, dimensional and shape stability, anti-surface-reflection, electrical insulation, UV degradation resistance, and weather resistance, and is highly productive due to possible film formation under atmospheric pressure. Accordingly, a light emitting device featuring high reliability, ease of manufacture and low cost is obtainable.

What is claimed is:

1. A light emitting device, comprising a substrate base material having at least light transparency and heat resistance, a lower electrode having light transmittance, a light emitting layer, and an upper electrode formed on the base material;

said device further comprising a silica film or siliceous film having a thickness of about 0.01 to 15 µm, which is formed on the substrate side as viewed from the light emitting layer or on opposite sides of the substrate by the steps of:

a) applying polysilazane thereto, and
b) subjecting the applied polysilazane to oxidative treatment.

2. The light emitting device of claim 1, wherein said substrate base material is formed of glass or resin.

3. The light emitting device of claim 1, wherein the silica film or siliceous film is disposed at least between said base material and said light emitting layer.

4. The light emitting device of claim 3, wherein TFTs are formed on the base material and the light emitting layer is disposed on the TFTs.

5. The light emitting device of claim 1, wherein the silica film or the siliceous film or both is disposed at least on opposite sides of the substrate.

6. The light emitting device of claim 1, wherein the silica film or siliceous film has been subjected to oxidative treatment under heated or humidified conditions or both.

7. The light emitting device of claim 1, wherein said polysilazane or modified product thereof or both each has a structural unit of the formula:

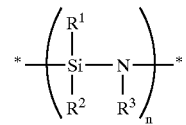

wherein $R^1$, $R^2$ and $R^3$ are each alkyl or hydrogen, and at least one of $R^1$, $R^2$ or $R^3$ is hydrogen; and n corresponds to an overage molecular weight of 100 to 50,000.

8. The light emitting device of claim 7, wherein the total number of carbon atoms in the alkyl groups is up to about 6.

9. The light emitting device of claim 1, which is an EL device.

10. The light emitting device of claim 1, wherein said alkyl for $R^1$, $R^2$ or $R^3$ is methyl.

11. The light emitting device of claim 1, wherein the substrate base material is a resin having a glass transition point, Tg, of at least 65° C. or heat resistance to at least 70° C. or both.

12. The light emitting device of claim 11, wherein the resin material is a non-halogenated resin.

13. The light emitting device of claim 11, wherein the resin material is a polyether sulfone (PES) resin.

14. The light emitting device of claim 11, wherein the resin material is a polycarbonate resin.

15. The light emitting device of claim 11, wherein the resin material is an amorphous polyolefin resin.

16. The light emitting device of claim 11, wherein the resin material is an aromatic polyester resin.

17. The light emitting device of claim 1, wherein the resin material has a thickness in the range of 5 to 150 µm.

18. The light emitting device of claim 1, wherein said light transparency is at least 60% transparency for light in the visible region.

19. The light emitting device of claim 11, wherein the resin base material has a molecular orientation ratio (MOR) of 1.0 to 3.0.

20. The light emitting device of claim 19, wherein said MOR is 1.0 to 2.0.

21. A method of forming a treated substrate for light emitting device according to claim 1, which comprises:

a) applying polysilazane to a substrate and;
b) subjecting the applied polysilazane to oxidative treatment, to form a silica film or siliceous film on said substrate.

22. A method of forming a light emitting device, which comprises the steps of:

a) forming a treated substance in accordance with claim 21; and
b) forming thereon a lower electrode having light transmittance, a light emitting layer and an upper electrode in order.

23. The light emitting device of claim 1, wherein the silica film or siliceous film has a thickness of about 0.01 to 10 µm.

* * * * *